(12) United States Patent
Yamao et al.

(10) Patent No.: US 10,399,854 B2
(45) Date of Patent: Sep. 3, 2019

(54) SILICON NITRIDE POWDER, SILICON NITRIDE SINTERED BODY AND CIRCUIT SUBSTRATE, AND PRODUCTION METHOD FOR SAID SILICON NITRIDE POWDER

(71) Applicant: Ube Industries, Ltd., Ube-shi (JP)

(72) Inventors: Takeshi Yamao, Ube (JP); Michio Honda, Ube (JP); Shinsuke Jida, Ube (JP)

(73) Assignee: Ube Industries, Ltd. (JP)

( * ) Notice: Subject to any disclaimer, the term of this patent is extended or adjusted under 35 U.S.C. 154(b) by 365 days.

(21) Appl. No.: 15/318,005

(22) PCT Filed: Jun. 16, 2015

(86) PCT No.: PCT/JP2015/067309
§ 371 (c)(1),
(2) Date: Dec. 12, 2016

(87) PCT Pub. No.: WO2015/194552
PCT Pub. Date: Dec. 23, 2015

(65) Prior Publication Data
US 2017/0107109 A1 Apr. 20, 2017

(30) Foreign Application Priority Data

Jun. 16, 2014 (JP) ................................. 2014-123330

(51) Int. Cl.
*C01B 21/068* (2006.01)
*C04B 35/584* (2006.01)
(Continued)

(52) U.S. Cl.
CPC .......... *C01B 21/068* (2013.01); *C04B 35/584* (2013.01); *C04B 35/626* (2013.01);
(Continued)

(58) Field of Classification Search
None
See application file for complete search history.

(56) References Cited

U.S. PATENT DOCUMENTS 5,641,438 A * 6/1997 Bunyan ................. F16J 15/064
264/104
5,759,481 A * 6/1998 Pujari ................... C04B 35/593
264/651
(Continued)

FOREIGN PATENT DOCUMENTS

JP 58-199707 A 11/1983
JP 59-207813 A 11/1984
(Continued)

OTHER PUBLICATIONS

Yamada et al.; Journal of Material Science Letters; 2, pp. 275-278; 1983.*

*Primary Examiner* — Guinever S Gregorio
(74) *Attorney, Agent, or Firm* — DLA Piper LLP (US)

(57) ABSTRACT

A silicon nitride powder having a specific surface area of 4.0 to 9.0 m²/g, a β phase proportion of less than 40 mass %, and an oxygen content of 0.20 to 0.95 mass %, wherein a frequency distribution curve obtained by measuring a volume-based particle size distribution by a laser diffraction scattering method has two peaks, peak tops of the peaks are present respectively at 0.4 to 0.7 μm and 1.5 to 3.0 μm, a ratio of frequencies of the peak tops ((frequency of the peak top in a particle diameter range of 0.4 to 0.7 μm)/(frequency of the peak top in a particle diameter range of 1.5 to 3.0 μm)) is 0.5 to 1.5, and a ratio $D50/D_{BET}$ (μm/μm) of a median diameter D50 (μm) determined by the measurement of particle size distribution to a specific surface area-equivalent diameter $D_{BET}$ (μm) calculated from the specific surface area is 3.5 or more.

17 Claims, 1 Drawing Sheet

(51) Int. Cl.
*C04B 35/626* (2006.01)
*H05K 1/02* (2006.01)
*H05K 1/03* (2006.01)

(52) U.S. Cl.
CPC ......... *H05K 1/0201* (2013.01); *H05K 1/0306* (2013.01); *C01P 2004/61* (2013.01); *C01P 2004/62* (2013.01); *C01P 2006/12* (2013.01); *C04B 2235/3882* (2013.01)

(56) References Cited

U.S. PATENT DOCUMENTS

| | | | |
|---|---|---|---|
| 6,394,812 B1 * | 5/2002 | Sullivan | A61K 35/407 424/93.7 |
| 6,472,075 B1 * | 10/2002 | Niwa | C04B 33/14 428/312.6 |
| 2002/0084103 A1 | 7/2002 | Komatsu et al. | |
| 2003/0134737 A1 * | 7/2003 | Wotting | C04B 35/584 501/97.1 |
| 2003/0186801 A1 * | 10/2003 | Inoue | B01D 39/2068 501/97.1 |
| 2013/0153824 A1 * | 6/2013 | Fujinaga | C01B 21/068 252/301.4 R |
| 2015/0056121 A1 | 2/2015 | Shibata et al. | |

FOREIGN PATENT DOCUMENTS

| | | |
|---|---|---|
| JP | 3-177307 A | 8/1991 |
| JP | 09-156912 | 6/1997 |
| JP | 9-156912 A | 6/1997 |
| JP | 11-292522 A | 10/1999 |
| JP | 2000-044210 | 2/2000 |
| JP | 2000-046474 | 2/2000 |
| JP | 2002-029849 | 1/2002 |
| JP | 2002-29849 A | 1/2002 |
| JP | 2002-201075 A | 7/2002 |
| JP | 2002-265276 | 9/2002 |
| JP | 2002-265276 A | 9/2002 |
| JP | 3900695 B2 | 1/2007 |
| JP | 3900696 B2 | 1/2007 |
| JP | 2013-71864 A | 4/2013 |
| WO | 2013/146713 A1 | 10/2013 |

* cited by examiner

SILICON NITRIDE POWDER, SILICON NITRIDE SINTERED BODY AND CIRCUIT SUBSTRATE, AND PRODUCTION METHOD FOR SAID SILICON NITRIDE POWDER

TECHNICAL FIELD

The present invention relates to a silicon nitride powder making it possible to obtain a dense silicon nitride sintered body having high mechanical strength, particularly, a silicon nitride sintered body having both high thermal conductivity and high mechanical strength, and a production method for the silicon nitride powder.

The present invention also relates to a silicon nitride sintered body having both high thermal conductivity and high mechanical strength, and a circuit substrate using the same.

BACKGROUND ART

A silicon nitride sintered body obtained by molding and heating/sintering a silicon nitride powder is excellent in the mechanical strength, corrosion resistance, thermal shock strength, thermal conductivity, electrical insulation property, etc., and therefore, being used, for example, as a wear-resistant member such as a cutting tip and a ball bearing, a high-temperature structural member such as an automotive engine component, and a circuit substrate. In the application to a circuit substrate, etc., a silicon nitride sintered body satisfying, among others, both high thermal conductivity and high mechanical strength at levels not less than before is demanded.

As such a silicon nitride sintered body, it is considered to be preferable to use, as the sintering aid, a magnesium oxide and a rare earth oxide, which are unlikely to raise the mechanical strength but likely to provide a sintered body having high thermal conductivity, in place of an aluminum oxide and a rare earth oxide, which facilitate obtaining a sintered body having high mechanical strength, and in addition, to use a silicon nitride powder having a reduced impurity content or a silicon nitride powder having an adjusted oxygen content, etc., as a raw material.

For example, Patent Document 1 discloses a silicon nitride sintered body obtained by sintering a silicon nitride powder having a β proportion of 93%, an Al content of 150 ppm and an oxygen amount of 0.9 mass %. Specifically, in Examples thereof, a silicon nitride sintered body having a thermal conductivity of 95 to 118 W/m·K and a three-point bending strength of 660 to 900 MPa is disclosed.

Patent Document 2 discloses a silicon nitride sintered body obtained by sintering a silicon nitride powder containing 1.1 mass % of oxygen, 0.10 mass % of an impurity cation and 97% of α-phase silicon nitride and having an average particle diameter of 0.55 μm. Specifically, in Examples thereof, a silicon nitride sintered body having a thermal conductivity of 50 to 130 W/m·K and a three-point bending strength of 600 to 850 MPa is disclosed.

Patent Document 3 discloses a silicon nitride sintered body obtained by sintering a silicon nitride powder having a specific surface area of 5.6 to 28.9 m²/g, specific proportions of internal oxygen and surface oxygen, and a specific particle size distribution, the silicon nitride powder being obtained by firing an amorphous Si—N(—H)-based compound having a small oxygen content ratio relative to the specific surface area at 1,450 to 1,650° C. by heating at a temperature rising rate of 12 to 100° C./min in the temperature range of 1,000 to 1,400° C. while flowing the compound in a continuous firing furnace. Specifically, in Examples thereof, a silicon nitride sintered body having a thermal conductivity of 130 to 142 W/m·K and a three-point bending strength of 605 to 660 MPa is disclosed.

Patent Document 4 discloses a technique for producing a silicon nitride sintered body having a thermal conductivity of 80 W/m·K or more, a three-point bending strength at room temperature of 600 MPa or more, and a fracture toughness of 5 MPa·m$^{1/2}$ by firing a silicon nitride powder having a particle size distribution with $d_{10}$, $d_{50}$ and $d_{100}$ of 0.5 to 0.8 μm, 2.5 to 4.5 μm, and 7.5 to 10.0 μm, respectively, and having an oxygen content of 0.01 to 0.5 wt %.

RELATED ART

Patent Document

Patent Document 1: Kokai (Japanese Unexamined Patent Publication) No. 2002-29849
Patent Document 2: Kokai No. 2002-201075
Patent Document 3: International Publication No. 2013/146713
Patent Document 4: Kokai No. 2002-265276
Patent Document 5: Kokai No. 9-156912
Patent Document 6: Japanese Patent No. 3,900,695
Patent Document 7: Japanese Patent No. 3,900,696

SUMMARY OF THE INVENTION

Problems to be Solved by the Invention

However, in Patent Document 1, in the Examples, the three-point bending strength of a silicon nitride sintered body having highest thermal conductivity of 118 W/m·K is 800 MPa and is relatively low, whereas the thermal conductivity of a silicon nitride sintered body having highest three-point bending strength of 900 MPa is 96 W/m·K and is low.

In Patent Document 2, in the Examples, the three-point bending strength of a silicon nitride sintered body having highest thermal conductivity of 130 W/m·K is 600 MPa and is low, whereas the thermal conductivity of a silicon nitride sintered body having highest three-point bending strength of 850 MPa is 50 W/m·K and is low.

In Patent Document 3, a silicon nitride sintered body having a thermal conductivity of 130 to 142 W/m·K is disclosed, but the three-point bending strength thereof is 660 MPa at the highest.

In Patent Document 4, a silicon nitride sintered body having a thermal conductivity of 105 to 115 W/m·K is disclosed, but the three-point bending strength thereof is 750 MPa at the highest.

In this way, it is disclosed that a silicon nitride sintered body having a thermal conductivity of, e.g., 100 W/m·K or more is obtained, for example, by adjusting the contents of impurities including oxygen in a silicon nitride powder as a raw material, but on the other hand, a silicon nitride sintered body having such high thermal conductivity is revealed to show a relative low mechanical strength. As apparent from these related arts, it has been conventionally difficult to achieve both high thermal conductivity and high mechanical strength in a silicon nitride sintered body.

A principal object of the present invention is to provide a silicon nitride sintered body having both high thermal conductivity and high mechanical strength, a circuit substrate using the silicon nitride sintered body, a silicon nitride powder working as a raw material for such a silicon nitride sintered body, and a production method of the silicon nitride powder.

Means to Solve the Problems

As a result of numerous intensive studies on an easily sinterable silicon nitride powder making it possible to obtain a dense silicon nitride sintered body having both high mechanical strength and high thermal conductivity, the present inventors have found that when an amorphous Si—N(—H)-based compound having a particular specific surface area and a specific oxygen content is fired at a temperature of 1,400 to 1,700° C. with a specific temperature rising rate in an inert gas or reducing gas atmosphere in the state of being housed and left to stand in a crucible, a silicon nitride powder having a particular specific surface area, a specific oxygen content, a specific β phase proportion, and a specific particle size distribution can be obtained. It has been also found that when this powder is used, a dense silicon nitride sintered body having both high mechanical strength and high thermal conductivity can be obtained. The present invention has been accomplished based on these findings.

That is, the present invention relates to a silicon nitride powder having a specific surface area of 4.0 to 9.0 m$^2$/g, a β phase proportion of less than 40 mass %, and an oxygen content of 0.20 to 0.95 mass %, wherein a frequency distribution curve obtained by measuring a volume-based particle size distribution by a laser diffraction scattering method has two peaks, the peak tops of the peaks are present respectively in a range of 0.4 to 0.7 μm and in a range of 1.5 to 3.0, a ratio of frequencies of the peak tops [(the frequency of the peak top in the particle diameter range of 0.4 to 0.7 μm)/(the frequency of the peak top in the particle diameter range of 1.5 to 3.0 μm)] is from 0.5 to 1.5, and a ratio D50/D$_{BET}$ (μm/μm) of a median diameter D50 (μm) determined by the measurement of particle size distribution to a specific surface area-equivalent diameter D$_{BET}$ (μm) calculated from the specific surface area is 3.5 or more.

In a preferred embodiment, the present invention relates to the silicon nitride powder above, wherein a ratio ΔDp/D50 calculated by dividing a difference ΔDp (μm) between the particle diameter (μm) at the peak top in the particle diameter range of 1.5 to 3.0 μm and the particle diameter (μm) at the peak top in the particle diameter range of 0.4 to 0.7 μm by the median diameter D50 (μm) is 1.10 or more.

In a preferred embodiment, the present invention relates to the silicon nitride powder above, wherein the β phase proportion is from 5 to 35 mass %.

In a preferred embodiment, the present invention relates to the silicon nitride powder above, wherein the minimum value of the particle diameter determined by the measurement of particle size distribution is in a range of from 0.10 to 0.30 μm and the maximum value of the particle diameter determined by the measurement of particle size distribution is in a range of from 6 to 30 μm.

The present invention also relates to a silicon nitride sintered body obtained by sintering the silicon nitride powder above.

In a preferred embodiment, the present invention relates to the silicon nitride sintered body, which contains magnesium oxide and yttrium oxide as sintering aids for the silicon nitride powder above.

In a preferred embodiment, the present invention relates to the silicon nitride sintered body, wherein the thermal conductivity at room temperature (25° C.) is 100 W/m·K or more and the three-point bending strength at room temperature (25° C.) is 900 MPa or more.

The present invention further relates to a circuit substrate using the silicon nitride sintered body above.

The present invention also relates to a method for producing a silicon nitride powder, including housing an amorphous Si—N(—H)-based compound having a specific surface area of 300 to 800 m$^2$/g in a crucible and firing the Si—N(—H)-based compound at a temperature of 1,400 to 1,700° C. in a nitrogen-containing inert gas atmosphere or in a nitrogen-containing reducing gas atmosphere without flowing the amorphous Si—N(—H)-based compound, wherein the oxygen content of the amorphous Si—N(—H)-based compound is from 0.15 to 0.50 mass % and at the time of firing, the amorphous Si—N(—H)-based compound is heated at a temperature rising rate of 250 to 1,000° C./hour in the temperature range of 1,000 to 1,400° C.

In a preferred embodiment, the present invention relates to the method for producing a silicon nitride powder, wherein a silicon nitride powder obtained by not pulverizing but disassociating the silicon nitride powder resulting from the firing has a specific surface area of 4.0 to 9.0 m$^2$/g, a β phase proportion of less than 40 mass % and an oxygen content of 0.20 to 0.95 mass %, the frequency distribution curve obtained by measuring a volume-based particle size distribution by a laser diffraction scattering method has two peaks, the peak tops of the peaks are present respectively in a range of 0.4 to 0.7 μm and in a range of 1.5 to 3.0 μm, the ratio of frequencies of the peak tops [(the frequency of the peak top in the particle diameter range of 0.4 to 0.7 μm)/(the frequency of the peak top in the particle diameter range of 1.5 to 3.0 μm)] is from 0.5 to 1.5, and a ratio D50/D$_{BET}$ (μm/μm) of the median diameter D50 (μm) determined by the measurement of particle size distribution to the specific surface area-equivalent diameter D$_{BET}$ (μm) calculated from the specific surface area is 3.5 or more.

Effects of the Invention

According to the present invention, an easily sinterable novel silicon nitride powder making it possible to obtain a dense silicon nitride sintered body having both an excellent mechanical strength and high thermal conductivity is provided.

According to the present invention, a dense silicon nitride sintered body having both an excellent mechanical strength and high thermal conductivity is provided. According to the present invention, a silicon nitride sintered body having high thermal conductivity of 100 W/m·K or more at room temperature and nevertheless having high three-point bending strength of 900 MPa or more at room temperature can be provided.

Furthermore, according to the present invention, a circuit substrate having both an excellent mechanical strength and high thermal conductivity is provided.

According to the method for producing a silicon nitride powder of the present invention, an easily sinterable novel silicon nitride powder making it possible to obtain a dense silicon nitride sintered body having both an excellent mechanical strength and high thermal conductivity can be provided.

MODE FOR CARRYING OUT THE INVENTION

Figure 1:
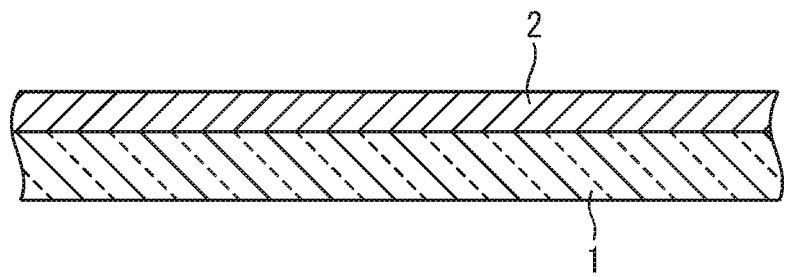
FIG. 1 A view schematically illustrating a cross-section of a circuit substrate.

The embodiments of the silicon nitride powder according to the present invention, a silicon nitride sintered body obtained therefrom, a circuit substrate using the same, and a production method of the silicon nitride powder are described in detail below.
(Silicon Nitride Powder)

The silicon nitride powder according to the present invention is a novel silicon nitride powder making it possible to obtain a silicon nitride sintered body having both high mechanical property and high thermal conductivity, which are unobtainable by conventional techniques. The silicon nitride powder according to the present invention is described below.

The silicon nitride powder according to the present invention is a silicon nitride powder characterized in that the specific surface area is from 4.0 to 9.0 m$^2$/g, the β phase proportion is less than 40 mass %, the oxygen content is from 0.20 to 0.95 mass %, the frequency distribution curve obtained by measuring a volume-based particle size distribution (hereinafter, sometimes referred to as the frequency distribution curve of particle size distribution) by a laser diffraction scattering method has two peaks, the peak tops of the peaks are present respectively in a range of 0.4 to 0.7 μm and in a range of 1.5 to 3.0, the ratio of frequencies of the peak tops [i.e., (the frequency of the peak top in the particle diameter range of 0.4 to 0.7 μm)/(the frequency of the peak top in the particle diameter range of 1.5 to 3.0 μm)] is from 0.5 to 1.5, and a ratio $D50/D_{BET}$ (μm/μm) of (the median diameter D50 (μm) determined by the measurement of particle size distribution) to (the specific surface area-equivalent diameter $D_{BET}$ (μm) calculated from the specific surface area) is 3.5 or more. In the following, the ratio of frequencies of the peak tops [(the frequency of the peak top in the particle diameter range of 0.4 to 0.7 μm)/(the frequency of the peak top in the particle diameter range of 1.5 to 3.0 μm)] is sometimes referred to as the ratio of frequencies of the peak tops.

The specific surface area of the silicon nitride powder according to the present invention is from 4.0 to 9.0 m$^2$/g. If the specific surface area is less than 4.0 m$^2$/g, the surface energy of particles decreases. Sintering of such a powder becomes difficult, and the strength and thermal conductivity of the sintered body obtained is likely to be reduced. If the specific surface area exceeds 9.0 m$^2$/g, the surface energy of particles increases, facilitating sintering, and since the oxygen content is also large, sintering is more facilitated, but columnar grains of β phase in the sintered body may undergo abnormal grain growth or be formed into fine grains, as a result, the relative density of the sintered body obtained tends to become non-uniform. In this case, the sintered body obtained is not uniformly densified and cannot have high mechanical property. Accordingly, in order to obtain a silicon nitride sintered body having both high mechanical strength and high thermal conductivity, the specific surface area of the raw material silicon nitride powder must be in a range of from 4.0 to 9.0 m$^2$/g. The specific surface area is preferably in a range of from 5.0 to 8.0 m$^2$/g.

The β phase proportion of the silicon nitride powder according to the present invention is less than 40 mass %. When the β phase proportion is less than 40 mass %, columnar grain formation of the β phase at the time of recrystallization in the process of sintering is accelerated and therefore, the densification rate during sintering increases. If the β phase proportion is 40 mass % or more, the sintered body obtained cannot be easily densified, and silicon nitride having both high mechanical strength and high thermal conductivity is not obtained. The β phase proportion is preferably from 5 to 35 mass %. Within this range, the sintered body obtained is likely to be densified in particular. The phase other than β phase in the silicon nitride powder according to the present invention is fundamentally constituted by α phase, and in a preferred embodiment, the powder is entirely composed of α phase and β phase. However, as phases other than α phase and β phase such as, amorphous silicon nitride may be contained in an amount of 2.0 mass % or less, more preferably 1.5 mass % or less. The method for measuring the β phase proportion in the silicon nitride powder is known. For example, a component other than silicon nitride can be determined by composition analysis, and the proportions of α phase and β phase in silicon nitride can be measured by the method described in the Examples. The proportion of amorphous silicon nitride can be measured as follows from the nitrogen amount in NH$_3$ gas generated by decomposition of the amorphous silicon nitride. An accurately weighed silicon nitride powder is added to an aqueous 1.0 N NaOH solution, the solution is heated and boiled to decompose only amorphous silicon nitride, the NH$_3$ gas generated is absorbed by an aqueous 1% boric acid solution, and the NH$_3$ amount in the absorbing solution is titrated with a 0.1 N sulfuric acid standard solution. The amount of decomposed and generated nitrogen (decomposed nitrogen amount) is calculated from the NH$_3$ amount in the absorbing solution. The proportion of the amorphous silicon nitride can be calculated from the decomposed nitrogen amount per g of the sample and the theoretical nitrogen amount of 39.94% of silicon nitride, according to the following formula (1):

Proportion of amorphous silicon nitride (mass %)= [decomposed nitrogen amount (g) per g of sample]×100/39.94     (1)

The oxygen content of the silicon nitride according to the present invention is from 0.20 to 0.95 mass %. If the oxygen content is less than 0.20 mass %, the silicon nitride sintered body cannot be easily densified and unless the amount added of a sintering aid is increased, a dense silicon nitride sintered body cannot be obtained. If the amount added of a sintering aid is large, the thermal conductivity does not rise and therefore, a silicon nitride sintered body having both high mechanical strength and a thermal conductivity cannot be obtained. On the other hand, if the oxygen content exceeds 0.95 mass %, the obtained silicon nitride sintered body tends to be densified and the mechanical strength is readily increased, but a silicon nitride sintered body having high thermal conductivity cannot be obtained. The oxygen content of the silicon nitride powder is preferably 0.20 to 0.95 mass %.

In the silicon nitride powder according to the present invention, the frequency distribution curve obtained by measuring a volume-based particle size distribution by a laser diffraction scattering method has two peaks, the particle diameters at the peak tops of the peaks are present respectively in a range of 0.4 to 0.7 μm and in a range of 1.5 to 3.0 μm, and the ratio of frequencies of the peak tops [(the frequency of the peak top in the particle diameter range of 0.4 to 0.7 µm)/(the frequency of the peak top in the particle diameter range of 1.5 to 3.0 µm)] is from 0.5 to 1.5. The ratio of frequencies of the peak tops is preferably from 0.5 to 1.2.

If the frequency distribution curve obtained by the measurement of particle size distribution has only one peak, the obtained silicon nitride sintered body cannot be easily densified, making it difficult to increase the mechanical strength and thermal conductivity, and a silicon nitride sintered body having both high mechanical strength and high thermal conductivity cannot be obtained.

In the case where the frequency distribution curve obtained by the measurement of particle size distribution has two peaks, if the particle diameter at the peak top having a smaller particle diameter out of those peaks is less than 0.4 µm, since a silicon nitride particle with a small particle diameter is surrounded by relatively large silicon nitride particles in the process of sintering and grain growth of β phase is accelerated, the proportion of a coarse columnar particle in the particles constituting the sintered body is increased, and the mechanical strength of the obtained silicon nitride sintered body is reduced.

In the case where the frequency distribution curve obtained by the measurement of particle size distribution has two peaks, if the particle diameter at the peak top having a larger particle diameter out of those peaks exceeds 3.0 µm, the sinterability is poor, and densification is not achieved, as a result, the mechanical strength and thermal conductivity of the obtained silicon nitride sintered body are reduced.

In the case where the frequency distribution curve obtained by the measurement of particle size distribution has two peaks, if the particle diameter at either one or both of two peak tops of the peaks is/are present between 0.7 µm and 1.5 µm, high molding density is less likely to be obtained and in turn, the obtained silicon nitride sintered body cannot be easily densified, as a result, the mechanical strength and thermal conductivity thereof are reduced.

If the ratio of frequencies of the peak tops [(the frequency of the peak top in the particle diameter range of 0.4 to 0.7 µm)/(the frequency of the peak top in the particle diameter range of 1.5 to 3.0 µm)] of two peaks in the frequency distribution curve of particle size distribution is less than 0.5 or exceeds 1.5, the obtained silicon nitride sintered body cannot be easily densified, and the mechanical strength and thermal conductivity thereof are reduced.

In the silicon nitride powder according to the present invention, it is preferred that the minimum value of the particle diameter determined by the measurement of particle size distribution, i.e., determined by measuring a volume-based particle size distribution by a laser diffraction scattering method, is from 0.10 to 0.30 µm and the maximum value of the particle diameter determined by said measurement of particle size distribution is from 6 to 30 µm. When the minimum value and maximum value of the particle diameter are in these ranges, the density at the time of molding can be increased, facilitating densification of the obtained silicon nitride sintered body, and since the uniformity of the microstructure of the obtained silicon nitride sintered body becomes high, a silicon nitride sintered body having both a particularly high mechanical strength and thermal conductivity can be obtained.

In the silicon nitride powder according to the present invention, the ratio $D50/D_{BET}$ (µm/µm) of the median diameter D50 (µm) determined by the measurement of particle size distribution, i.e., determined by measuring a volume-based particle size distribution by a laser diffraction scattering method, to the specific surface area-equivalent diameter $D_{BET}$ (µm) calculated from the specific surface area is preferably 3.5 or more. Here, the median diameter D50 indicates a particle diameter when the volume integrated from a smaller particle diameter to a larger particle diameter in the volume-based particle diameter distribution corresponds to 50% of the entire volume, and $D_{BET}$ indicates a diameter of a particle (particle diameter) calculated, assuming that the silicon nitride powder is spherical, from the specific surface area of the silicon nitride powder measured by the BET method. If $D50/D_{BET}$ (µm/µm) is less than 3.5, a silicon nitride sintered body having both high mechanical strength and a thermal conductivity cannot be easily obtained. The $D50/D_{BET}$ (µm/µm) of the silicon nitride powder according to the present invention is preferably 10 or less. Because, when $D50/D_{BET}$ (µm/µm) is 10 or less, the obtained silicon nitride sintered body is less likely to cause warpage or deformation. The lower limit value of $D50/D_{BET}$ (µm/µm) is preferably 4. When the $D50/D_{BET}$ value is 4 or more, a silicon nitride sintered body having both a particularly high mechanical strength and thermal conductivity is readily obtained.

In the silicon nitride powder according to the present invention, the ratio ΔDp/D50 of the difference ΔDp between the particle diameters (µm) at the respective peak tops to the median diameter D50, calculated by dividing the difference between the particle diameter (µm) at the peak top in the particle diameter range of 1.5 to 3.0 µm and the particle diameter (µm) at the peak top in the particle diameter range of 0.4 to 0.7 µm by D50 (µm), is preferably 1.10 or more. Because, when the ratio is 1.10 or more, a sintered body having a particularly high thermal conductivity is readily obtained. The upper limit value of ΔDp/D50 is preferably 3. When ΔDp/D50 is 3 or less, densification of the obtained silicon nitride sintered body is facilitated in particular and a silicon nitride sintered body having both a particularly high mechanical strength and thermal conductivity is likely to be obtained.

The silicon nitride powder according to the present invention is a novel silicon nitride powder having a specific surface area of 4.0 to 9.0 m²/g and a β phase proportion of less than 40 mass %, wherein the oxygen content is from 0.20 to 0.95 mass %, the frequency distribution curve obtained by measuring a volume-based particle size distribution by a laser diffraction scattering method has two peaks, the peak tops of the peaks are present respectively in a range of 0.4 to 0.7 µm and in a range of 1.5 to 3.0, the ratio of frequencies of the peak tops [(the frequency of the peak top in the particle diameter range of 0.4 to 0.7 µm)/(the frequency of the peak top in the particle diameter range of 1.5 to 3.0 µm)] is from 0.5 to 1.5, and the ratio $D50/D_{BET}$ (µm/µm) of the median diameter D50 (µm) determined by the measurement of particle size distribution to the specific surface area-equivalent diameter $D_{BET}$ (µm) calculated from the specific surface area is 3.5 or more, and the silicon nitride powder is suitable as a raw material for a silicon nitride sintered body having both high mechanical strength and high thermal conductivity. When the silicon nitride powder according to the present invention is used, a silicon nitride sintered body having high thermal conductivity of 100 W/m·K or more at room temperature and nevertheless having high three-point bending strength of 900 MPa or more at room temperature can be provided.

(Silicon Nitride Sintered Body and Circuit Substrate Using the Same)

The silicon nitride sintered body according to the present invention and the circuit substrate using the same are described below.

The silicon nitride sintered body according to the present invention is manufactured by the following production method. The silicon nitride powder according to the present invention and a sintering aid are mixed, the resulting mixed powder is molded, and the obtained compact is sintered, whereby the silicon nitride sintered body according to the present invention having both high mechanical strength and high thermal conductivity can be produced. Alternatively, the silicon nitride sintered body according to the present invention having both high mechanical strength and high thermal conductivity can be produced while simultaneously performing molding and sintering. The silicon nitride sintered body according to the present invention can have high thermal conductivity of 100 W/m·K or more, preferably 105 W/m·K or more, more preferably 110 W/m·K or more, at room temperature and nevertheless have high three-point bending strength of 900 MPa or more, preferably 1,000 MPa or more, more preferably 1,100 MPa or more, at room temperature.

In the present invention, sintering aids such as yttrium oxide, lanthanoid rare-earth oxide and magnesium oxide can be used individually or in appropriate combination according to the purpose. In addition, a magnesium compound such as $MgSiN_2$ and $Mg_2Si$, titanium oxide, zirconium oxide, lithium oxide, boron oxide, calcium oxide, etc., can be used individually or in appropriate combination with at least one member of yttrium oxide, lanthanoid rare-earth oxide, magnesium oxide, etc. The silicon nitride sintered body according to the present invention is preferably a sintered body obtained by sintering the silicon nitride powder according to the present invention with use of, as a sintering aid, a powder composed of magnesium oxide and yttrium oxide, because both high strength and high thermal conductivity can be achieved at high levels.

The amount added of the sintering aid varies depending on the kind of the sintering aid but in general, is preferably from 1.0 to 10.0 mass %, more preferably from 1.5 to 7.0 mass %, based on the total of the silicon nitride particle and the sintering aid. As for the kind of the sintering aid, a combination of magnesium oxide with one element or two or more elements selected from Ca, Sr, Ba, Y, La, Ce, Pr, Nd, Sm, Gd, Dy, Ho, Er and Yb is preferred. For example, the amounts added of magnesium oxide and yttrium oxide are respectively from 0.5 to 2.5 mass % and from 1.0 to 4.5 mass %, and the total thereof is preferably from 1.5 to 7.0 mass %.

The method for mixing the silicon nitride powder according to the present invention and a sintering aid may be any method irrespective of wet or dry process as long as it is a method capable of uniformly mixing these powders, and a known method such as rotary mill, barrel mill and vibration mill can be used. For example, a method of mixing the silicon nitride powder, a sintering aid, a binder for molding and a dispersant in a ball mill by using water, etc., as the dispersion medium and then forming the mixed powder into granules by spray drying may be employed.

As the method for molding the mixed powder, a known method such as press molding, cast molding, extrusion molding, injection molding, sludge molding and cold isostatic molding can be used. For example, CIP (cold isostatic pressing) molding of filling a rubber-made mold with the obtained granular mixed powder and applying a pressure thereon to obtain a compact may be employed.

The method for sintering the compact may be any method as long as it is a method capable of densifying the sintered body obtained, but normal pressure sintering in an inert gas atmosphere such as nitrogen or nitrogen-mixed argon, or gas pressure sintering where the gas pressure in an inert gas atmosphere such as nitrogen or nitrogen-mixed argon is raised to approximately from 0.2 to 10 MPa, is employed. In general, sintering may be performed using nitrogen gas at a temperature of 1,700 to 1,800° C. in normal pressure sintering and at a temperature of 1,800 to 2,000° C. in gas pressure sintering.

In addition, hot pressing that is a method of performing molding and sintering at the same time may also be employed. The sintering by hot pressing may be performed usually in a nitrogen atmosphere under a pressure of 0.2 to 10 MPa at a sintering temperature of 1,950 to 2,050° C.

The strength can be further enhanced by subjecting the obtained silicon nitride sintered body to HIP (hot isostatic pressing) treatment. The HIP treatment may be performed usually in a nitrogen atmosphere under a pressure of 30 to 200 MPa at a sintering temperature of 2,100 to 2,200° C.

In the obtained silicon nitride sintered body, the relative density is preferably 96% or more, more preferably 97% or more, still more preferably 98% or more. The relative density of the silicon nitride sintered body is a density of the silicon nitride sintered body, expressed in percent as a relative density to the true density of silicon nitride. If the relative density is low, it is difficult to increase the mechanical strength.

The circuit substrate according to the present invention can be produced by the following method. The circuit substrate is a plate-like component having formed on the surface thereof an electronic circuit, or a component (not having an electronic circuit) for forming an electronic circuit on the surface thereof. FIG. 1 schematically illustrates the cross-section of a circuit substrate. In the example of FIG. 1, an electronic circuit 2 or an electrically conductive material layer 2 for forming an electronic circuit is provided on a surface of a plate-like substrate 1 composed of the silicon nitride sintered body.

The circuit substrate according to the present invention can be produced, for example, by machining the silicon nitride sintered body according to the present invention by grinding, etc., into a plate-like form, connecting a metal sheet, etc., to the obtained plate-like sintered body, and removing a portion of the metal sheet by etching, etc., to form a conductor circuit pattern on a surface of the plate-like sintered body.

Other methods include the following method. A sintering aid, an organic binder, etc., are added to the silicon nitride powder according to the present invention to prepare a raw material mixture, and the obtained raw material mixture is molded by a sheet molding method such as doctor blade method to obtain a compact (green sheet). Thereafter, a paste for conductor formation is screen-printed on a compact surface to form a conductor circuit pattern in a predetermined shape. The organic binder is removed by a degreasing treatment, and the obtained compact having formed thereon a pattern is fired in an inert atmosphere, whereby the circuit substrate according to the present invention can be produced.

(Production Method of Silicon Nitride Powder)

The silicon nitride powder according to the present invention can be preferably produced by housing an amorphous Si—N(—H)-based compound having a specific surface area of 300 to 800 $m^2$/g and an oxygen content of 0.15 to 0.50 mass % in a crucible and firing the compound at a temperature of 1,400 to 1,700° C. by heating with a temperature rising rate of 250 to 1,000° C./hour in the temperature range of 1,000 to 1,400° C. in a nitrogen-containing inert gas atmosphere or in a nitrogen-containing reducing gas atmosphere.

(Production Method of Amorphous Si—N(—H)-Based Compound)

The production method of an amorphous Si—N(—H)-based compound that can be used as a raw material for producing the silicon nitride powder according to the present invention, is described.

In the present invention, a crystalline silicon nitride powder can be produced by firing an amorphous Si—N(—H)-based compound. The amorphous Si—N(—H)-based compound used in the present invention is an amorphous Si—N(—H)-based compound containing Si, N and H elements or an amorphous silicon nitride containing Si and N, each obtained by heating and decomposing a part or the whole of a nitrogen-containing silane compound such as silicon diimide, silicon tetraamide and silicon chloroimide, and is represented by the following composition formula (1). Incidentally, in the present invention, the amorphous Si—N(—H)-based compound encompasses all of a series of compounds represented by composition formula (2) from $Si_6N_1(NH)_{10.5}$ when x=0.5 to amorphous silicon nitride when x=4, and $Si_6N_6(NH)_3$ when x=3 is called silicon nitrogen imide. Although it is described later, the amorphous Si—N—(—H)-based compound may contain oxygen contained in the raw material nitrogen-containing silane compound and/or oxygen derived from oxygen in the atmosphere at the time of thermal decomposition of the nitrogen-containing silane compound.

$$Si_6N_{2x}(NH)_{12-3x} \quad (2)$$

(provided that in the formula, x=0.5 to 4, and although not clearly shown in the composition formula, a compound containing oxygen or a halogen as an impurity is encompassed).

As the nitrogen-containing silane compound for use in the present invention, silicon diimide, silicon tetraamide, silicon chloroimide, etc., are used. These compounds are represented by the following composition formula (3). In the present invention, for the sake of convenience, the nitrogen-containing silane compounds represented by the following composition formula (3) where y=8 to 12 are referred to as silicon diimide. Although it is described later, the nitrogen-containing silane compound may contain oxygen derived from oxygen in the atmosphere at the time of gas-phase synthesis of the nitrogen-containing silane compound or oxygen derived from water in a reaction solvent at the time of liquid-phase synthesis of the nitrogen-containing silane compound.

$$Si_6(NH)_y(NH_2)_{24-2y} \quad (3)$$

(provided that in the formula, y=0 to 12 and although not clearly shown in the composition formula, a compound containing a halogen as an impurity is encompassed).

The amorphous Si—N(—H)-based compound for use in the present invention can be produced by a known method, for example, by a method of thermally decomposing the nitrogen-containing silane compound above at a temperature of 1,200° C. or less in a nitrogen or ammonia gas atmosphere, or a method of reacting a silicon halide such as silicon tetrachloride, silicon tetrabromide or silicon tetraiodide with ammonia at high temperature.

The specific surface area of the amorphous Si—N(—H)-based compound used for producing the silicon nitride particle according to the present invention is preferably from 300 to 800 m²/g. When the specific surface area of the amorphous Si—N(—H)-based compound is in this range, the rate of the crystallization reaction of silicon nitride during firing is easily controlled to an appropriate rate and therefore, it is easy to adjust the specific surface area of the obtained silicon nitride powder to the range of 4.0 to 9.0 m²/g.

If the specific surface area of the amorphous Si—N(H—)-based compound is less than 300 m²/g, very rapid crystallization occurs in the temperature range of 1,000 to 1,400° C., particularly from 1,100 to 1,250° C., during firing to increase the proportion of particles having a small particle diameter and in particular, since a particle having a small particle diameter is produced, it is likely that the specific surface area of the obtained silicon nitride powder becomes large and the minimum value of the particle diameter becomes small. Furthermore, in the obtained silicon nitride powder, the frequency distribution curve obtained by measuring a volume-based particle size distribution by a laser diffraction scattering method tends to have only one peak with the peak top being in the relatively small particle diameter range. Even when such a silicon nitride powder is sintered, the obtained silicon nitride sintered body is less likely to be densified, and the mechanical strength and thermal conductivity cannot be easily increased. In addition, heat generation by crystallization greatly damages a firing vessel used in a batch furnace and a pusher, which may cause deterioration of the production cost.

If the specific surface area of the amorphous Si—N(—H)-based compound exceeds 800 m²/g, the crystallization reaction slowly proceeds, and in the obtained silicon nitride powder, it is likely that the proportion of particles having a large particle diameter is increased and the specific surface area falls below 4.0 m²/g. In addition, the frequency distribution curve of particle size distribution tends to have only one peak in a large particle diameter range or even if it has two peaks, the particle diameter at the peak top in the larger particle diameter range is apt to exceed 3.0 μm. Even when such a silicon nitride powder is sintered, the obtained silicon nitride sintered body is less likely to be densified, and the mechanical strength and thermal conductivity cannot be easily increased. In addition, if the specific surface area of the amorphous Si—N(—H)-based compound exceeds 800 m²/g, oxidation readily proceeds even in an atmosphere containing slight oxygen or water, making it difficult to adjust the oxygen content of the amorphous Si—N(—H)-based compound to be subjected to firing.

The specific surface area of the amorphous Si—N(—H)-based compound can be adjusted by the specific surface area of a nitrogen-containing silane compound working as a raw material thereof and the maximum temperature at the time of heating and decomposition of the nitrogen-containing silane compound. As the specific surface area of the nitrogen-containing silane compound is larger or as the maximum temperature at the time of heating and decomposition is lower, the specific surface area of the amorphous Si—N(—H)-based compound can be increased. The specific surface area of the nitrogen-containing silane compound can be adjusted, when the nitrogen-containing silane compound is silicon diimide, by a known method described, for example, in Patent Document 5, i.e., a method of changing the ratio between silicon halide and liquid ammonia (silicon halide/liquid ammonia (volume ratio)) when reacting a silicon halide with liquid ammonia. The specific surface area of the nitrogen-containing silane compound can be increased by raising the above-described silicon halide/liquid ammonia ratio.

The oxygen content of the amorphous Si—N(—H)-based compound used for the production of the silicon nitride particle of the present invention is preferably from 0.15 to 0.50 mass %.

If an amorphous Si—N(—H)-based compound having a large oxygen content is used as the raw material, crystallization starts at high temperature and rapidly proceeds and therefore, the rate of production of a crystal nucleus increases. As a result, in the obtained silicon nitride powder, it is likely that the primary particle is small and the specific surface area is large.

If the oxygen content of the amorphous Si—N(—H)-based compound exceeds 0.50 mass %, in the obtained silicon nitride powder, the oxygen content is increased and it is also likely that the primary particle is small and the specific surface area exceeds 9.0 $m^2/g$. In addition, the β phase proportion tends to be decreased. Furthermore, the frequency distribution curve of particle size distribution is apt to have only one peak with the peak top being in a particle diameter range of less than 0.4 μm. If the oxygen content of the amorphous Si—N(—H)-based compound is large and at the same time, the amorphous Si—N(—H)-based compound is fired by raising the temperature rising rate in the temperature range of 1,000 to 1,400° C. while flowing the compound, in the obtained silicon nitride powder, the proportion of particles having a small primary particle diameter is likely to be more increased, and some thereof may be fused to form a relatively large particle. In this case, the frequency distribution curve of particle size distribution may have two peaks, but the particle diameter at the peak top in the larger particle diameter range tends to exceed 3.0 μm. Moreover, the oxygen content of the obtained silicon nitride powder is apt to exceed 0.95 mass %. Even when such a silicon nitride powder is sintered, the obtained silicon nitride sintered body cannot be easily densified, and even if it can be densified, the mechanical strength of the sintered body is likely to decrease. In addition, since the oxygen content is large, the thermal conductivity cannot be easily increased.

If an amorphous Si—N(—H)-based compound having a small oxygen content is used as the raw material, crystallization starts at a low temperature and slowly proceeds and therefore, crystal growth proceeds in preference to crystal nucleus production in the process of crystallization. As a result, the obtained silicon nitride powder tends to increase in the proportion of particles having a large particle diameter and decrease in the specific surface area.

In particular, if the oxygen content of the amorphous Si—N(—H)-based compound according to the present invention is less than 0.15 mass %, in the obtained silicon nitride powder, the oxygen content is decreased and it is also likely that the primary particle is large and the specific surface area is less than 4.0 $m^2/g$. In addition, the β phase proportion tends to be increased. Furthermore, the frequency distribution curve of particle size distribution is apt to have only one peak with the peak top being in a particle diameter range of more than 0.7 μm. If an amorphous Si—N(—H)-based compound having a relatively large specific surface area is used as the raw material, some particles in the obtained silicon nitride powder may be coarsened. In this case, the frequency distribution curve of particle size distribution may have two peaks, but the particle diameter at the peak top in the larger particle diameter range exceeds 3.0 μm. Moreover, the oxygen content of the obtained silicon nitride powder is apt to decrease. Even when such a silicon nitride powder is sintered, the obtained silicon nitride sintered body cannot be easily densified, and the mechanical strength and thermal conductivity are not increased.

The oxygen content of the amorphous Si—N(—H)-based compound can be adjusted by controlling the oxygen amount of the nitrogen-containing silane compound and the oxygen partial pressure (oxygen concentration) and/or the flow rate of the atmosphere at the time of heating and decomposition of the nitrogen-containing silane compound. As the oxygen amount of the nitrogen-containing silane compound is smaller or as the oxygen partial pressure or the flow rate of the atmosphere at the time of heating and decomposition is lower, the oxygen content of the amorphous Si—N(—H)-based compound can be reduced. In addition, as the oxygen amount of the nitrogen-containing silane compound is larger or the oxygen partial pressure or the flow rate of the atmosphere at the time of heating and decomposition is higher, the oxygen content of the amorphous Si—N(—H)-based compound can be increased. The oxygen content of the nitrogen-containing silane compound can be adjusted by the concentration of oxygen in the atmosphere gas during reaction in the case of reacting a silicon halide such as silicon tetrachloride, silicon tetrabromide or silicon tetraiodide with ammonia in a gas phase, and can be adjusted by controlling the water amount in an organic reaction solvent such as toluene in the case of reacting the silicon halide above with liquid ammonia. As the water amount in an organic reaction solvent is smaller, the oxygen content of the nitrogen-containing silane compound can be reduced, and as the water amount in the organic reaction solvent is larger, the oxygen content of the nitrogen-containing silane compound can be increased.

(Production Method of Silicon Nitride Powder from Amorphous Si—N(—H)-Based Compound)

The method for producing the silicon nitride powder according to the present invention is described.

The silicon nitride powder according to the present invention can be produced by housing an amorphous Si—N(—H)-based compound having a specific surface area of 300 to 800 $m^2/g$ and an oxygen content of 0.15 to 0.50 mass % in a crucible and heating the Si—N(—H)-based compound at a temperature rising rate of 250 to 1,000° C./hour in the temperature range of 1,000 to 1,400° C., and firing the amorphous Si—N(—H)-based compound at a holding temperature of 1,400 to 1,700° C., in a nitrogen-containing inert gas atmosphere or in a nitrogen-containing reducing gas atmosphere without flowing the amorphous Si—N(—H)-based compound.

In the production of the silicon nitride powder of the present invention, the amorphous Si—N(—H)-based compound obtained by the above-described method (heating and decomposing a part or the whole of a nitrogen-containing silane compound) may be disassociated not pulverized, and the thus-obtained disassociated amorphous Si—N(—H)-based compound can be preferably used. According to the method described above, the obtained amorphous Si—N(—H) based compound, when only disassociated without pulverizing and classifying the compound, can have properties, such as the specific surface area and oxygen content, required of the amorphous Si—N(—H)-based compound used for the production method of the silicon nitride powder according to the present invention. In addition, when the particles are not pulverized but are only disassociated, the procurement cost is decreased and at the same time, a foreign matter such as metal or resin can be prevented from getting mixed into the particles. Contamination of a foreign matter into the final silicon nitride powder tends to provide an origin for fracture of a sintered body and may reduce the mechanical strength of the sintered body. The disassociated amorphous Si—N(—H)-based compound is preferably at least partially molded in a granular shape, housed in a crucible and fired. When the amorphous Si—N(—H)-based compound is disassociated, at least partially molded in a granular shape and fired, production of needle-like crystal grains and fine particles is likely to be suppressed. As a result, the minimum value of the particle diameter is relatively increased or the proportion of granulated particles is relatively increased, and it becomes easy to obtain a silicon nitride powder capable of more increasing the density of a sintered body. In addition, control of the packing density of the amorphous Si—N(—H)-based compound in the crucible is facilitated.

The disassociation is preferably performed not to allow an aggregated particle exceeding 50 μm to remain in the amorphous Si—N(—H)-based compound before molding, and more preferably performed not to allow an aggregated particle exceeding 30 μm to remain. Here, disassociation of the amorphous Si—N(—H)-based compound is different from pulverization aiming at fracture of primary particles and is a treatment performed for the purpose of disassociating aggregation or agglomeration of relatively large aggregated particles. In the case of performing a disassociation treatment, a vibration ball milling treatment is preferably performed by housing the amorphous Si—N(—H)-based compound together with balls in a pot. In the vibration ball milling treatment, a pot of which inner wall surface is lined with a resin, and a ball lined with a resin or a ball made of a silicon nitride sintered body are preferably used. The disassociation of the amorphous Si—N(—H)-based compound is preferably performed in an inert gas atmosphere such as nitrogen atmosphere so as to prevent oxidation of the amorphous Si—N(—H)-based compound. As the vibration ball milling treatment, either a batch-type vibration ball milling treatment of performing the treatment by housing the powder before disassociation in a pot, or a continuous vibration ball milling treatment of performing the treatment while continuously supplying the powder before disassociation from a feeder into a pot, may be employed. Either a batch-type or continuous vibration ball milling treatment may be selected according to the amount of throughput.

In the case of molding at least part of the amorphous Si—N(—H)-based compound in a granular shape, the compound is preferably molded into an almond shape of from 6 mm (thickness)×8 mm (minor axis diameter)×12 mm (major axis diameter) to 8 mm (thickness)×12 mm (minor axis diameter)×18 mm (major axis diameter) in a nitrogen atmosphere by using a briquette machine, Model BGS-IV, manufactured by Sintokogio, Ltd. such that the apparent density becomes from 0.40 to 0.60 g/cm$^3$ in a nitrogen atmosphere. Here, the apparent density of a granular molded product of the amorphous Si—N(—H)-based compound is measured by the Archimedes method using normal-hexane for the immersion liquid. When at least part of the amorphous Si—N(—H)-based compound is formed into such a granular molded product, control of the packing density, in a crucible, of the amorphous Si—N(—H)-based compound to be subjected to firing is facilitated in particular.

The amorphous Si—N(—H)-based compound according to the present invention is housed in a crucible and fired without flowing the amorphous Si—N(—H)-based compound, and this means to fire the amorphous Si—N(—H)-based compound by using a batch furnace, a pusher continuous furnace, or the like in the state of the amorphous Si—N(—H)-based compound being housed in a crucible and left to stand still in the crucible and is distinguished from firing performed using a rotary kiln furnace, etc., while flowing the amorphous Si—N(—H)-based compound. More specifically, the crucible housing the amorphous Si—N(—H)-based compound may stand still or move in the heating furnace, but the amorphous Si—N(—H)-based compound is left to stand still in the crucible and does not flow.

If the amorphous Si—N(—H)-based compound according to the present invention is fired using a rotary kiln furnace, etc., while flowing the compound, in the obtained silicon nitride powder, the frequency distribution curve obtained by the measurement of particle size distribution tends to have only one peak in a relatively small particle diameter range or even if it has two peaks, the frequency of the peak top in the larger particle diameter range is apt to decrease and in turn, the ratio of frequencies of the peak tops [(the frequency of the peak top in the particle diameter range of 0.4 to 0.7 μm)/(the frequency of the peak top in the particle diameter range of 1.5 to 3.0 μm)] is likely to exceed 1.5. Even if such a silicon nitride powder is sintered, the silicon nitride sintered body according to the present invention having both high mechanical strength and high thermal conductivity cannot be easily obtained.

In the present invention, the crucible used for firing of the amorphous Si—N(—H)-based compound is not particularly limited, but a crucible having an inside dimension of the side or diameter of the crucible bottom being 15 mm or more and the height being 150 mm or more is preferably used. For example, a box-type (bottomed square tubular) crucible having an inside dimension of the side of the bottom being 15 mm or more and the height being 150 mm or more, or a cylindrical crucible having an inside dimension of the inner diameter of the bottom being 15 mm or more and the height being 150 mm or more is preferably used. From the viewpoint of productivity, for example, a box-type crucible in which the side of the bottom is 150 mm or more and the interior is partitioned by grid plates to have a spaced interval of 15 mm or more, or a bottomed cylindrical crucible in which the inner diameter of the bottom is 150 mm or more and the interior is partitioned by concentrically arranged cylinders to have a spaced interval of 15 mm or more, is preferably used. In view of costs of the crucible and a firing furnace housing the crucible, the crucible is preferably not too large, and it is preferable to use a crucible having an inside dimension of the one-side dimension or inner diameter being 400 mm or less and the height being 600 mm or less. For example, the crucibles described in Examples of Patent Documents 6 and 7 are preferably used.

In the present invention, although it is not particularly limited, the amorphous Si—N(—H)-based compound is preferably housed in a crucible at a packing density of 0.10 to 0.55 g/mL and fired. The packing density can be easily adjusted by the proportion of a granular molded product of the amorphous Si—N(—H)-based compound, and the packing density is preferably adjusted to a range of 0.25 to 0.50 g/mL by setting the proportion of a granular molded product to 50 mass % or more.

In the present invention, the maximum temperature during firing is from 1,400 to 1,700° C. If the firing temperature is less than 1,400° C., the β phase proportion in the obtained silicon nitride powder tends to be decreased. The crystallinity may also be reduced. If the firing temperature exceeds 1,700° C., in the obtained silicon nitride powder, the proportion of fused particles may be increased, and the frequency distribution curve obtained by the measurement of particle size distribution may have a peak with the peak top being in a range of more than 3.0 μm. Furthermore, if the firing temperature exceeds 1,750° C., decomposition of the silicon nitride powder starts. Even when a silicon nitride powder obtained by firing at a maximum temperature of less than 1,400° C. or a silicon nitride powder obtained by firing at a maximum temperature of more than 1,700° C. is fired, neither a sintered body having high mechanical strength nor a sintered body having high thermal conductivity cannot be easily obtained. The firing temperature is not limited as long as it is from 1,400 to 1,700° C., but the firing temperature is preferably from 1,400 to 1,600° C., more preferably from 1,450 to 1,550° C. The maximum temperature (or firing temperature) during firing is preferably held for 0.25 hours or more, more preferably for 0.25 to 2.0 hours.

In the present invention, the amorphous Si—N(—H)-based compound is housed in a crucible and fired by heating at a temperature rising rate of 250 to 1,000° C./hour in the temperature range of 1,000 to 1,400° C. The temperature rising rate in the temperature range of 1,000 to 1,400° C. is preferably from 300 to 900° C./hour. If the temperature rising rate in the temperature range of 1,000 to 1,400° C. during firing is less than 250° C./hour, in the obtained silicon nitride powder, it is likely that the specific surface area is relatively small and the frequency distribution curve obtained by the measurement of particle size distribution is sharp and has only one peak in a relatively large particle diameter range. In addition, the β phase proportion in the obtained silicon nitride powder tends to be decreased. Even when such a silicon nitride powder is sintered, the silicon nitride sintered body according to the present invention having high in both mechanical strength and thermal conductivity cannot be easily obtained.

If the temperature rising rate in the temperature range of 1,000 to 1,400° C. during firing exceeds 1,000° C./hour, in the obtained silicon nitride powder, it is likely that the specific surface area is relatively large and the frequency distribution curve obtained by the measurement of particle size distribution is broad and has only one peak with the peak top in a relatively small particle diameter range. In addition, the β phase proportion in the obtained silicon nitride powder tends to be increased. Even if such a silicon nitride powder is sintered, the silicon nitride sintered body according to the present invention having high in both mechanical strength and thermal conductivity cannot be easily obtained.

In the present invention, an amorphous Si—N(—H)-based compound having a relatively large specific area and a smaller oxygen content than before is housed in a crucible and fired by heating at a temperature rising rate of 250 to 1,000° C./hour in the temperature range of 1,000 to 1,400° C., which is unprecedentedly high as the temperature rising rate in the case of housing an amorphous Si—N(—H)-based compound in a crucible and firing the compound, whereby the non-conventional silicon nitride powder according to the present invention capable of producing a dense silicon nitride sintered body having both high mechanical strength and high thermal conductivity can be obtained.

In the present invention, the silicon nitride powder after firing is preferably disassociated without applying a pulverization treatment. By not pulverizing but only disassociating the particles, the cost is reduced and contamination of a foreign matter such as metal or resin or an excessive increase in the oxygen content is prevented. Contamination of a foreign matter into the final silicon nitride powder tends to provide an origin for fracture of a sintered body and may reduce the mechanical strength of the sintered body, and an excessive increase in the oxygen content may reduce the thermal conductivity. In the case of performing a disassociation treatment, the disassociation treatment is preferably the same treatment as the disassociation of the amorphous Si—N(—H)-based compound and is not a pulverization treatment of fracturing primary particles of the silicon nitride powder but is a treatment of disassociating aggregation of relatively large aggregated particles. In the case of performing a disassociation treatment, it is preferable to house the silicon nitride powder together with balls in a pot and perform a vibration ball mill treatment or a jet milling treatment. In the case of performing a vibration ball milling treatment, a pot of which inner wall surface is lined with a resin, and a ball lined with a resin or a ball made of a silicon nitride sintered body are preferably used. In the case of performing a jet milling treatment, the disassociation treatment is preferably performed in a jet mill lined with a silicon nitride sintered body. The atmosphere in which the disassociation treatment is performed is not particularly limited and may be either an inert gas atmosphere such as nitrogen or an oxygen-containing atmosphere such as air. In the case of performing disassociation by a vibration ball milling treatment, either a batch-type vibration ball milling treatment of performing the treatment by housing the powder before disassociation in a pot, or a continuous vibration ball milling treatment of performing the treatment while continuously supplying the powder before disassociation from a feeder into a pot, may be employed. Either a batch-type or continuous vibration ball milling treatment may be selected according to the amount of throughput. By performing the above-described disassociation treatment, the maximum value of the particle diameter determined by the measurement of particle size distribution of the obtained silicon nitride powder can be made to be 30 μm or less, so that a silicon nitride powder in which the minimum value of the particle diameter determined by the measurement of particle size distribution is from 0.10 to 0.30 μm and the maximum value of the particle diameter determined by the measurement of particle size distribution is from 6 to 30 μm can be obtained. When such a silicon nitride powder is used for the raw material, the density of a compact of the silicon nitride powder can be readily increased and, for example, in the case of uniaxial molding of the silicon nitride powder, the density of the compact can be increased to more than 48% by the molding under a pressure of about 2 ton/cm².

Only by the method for producing a silicon nitride powder according to the present invention, a silicon nitride powder having a specific surface area of 4.0 to 9.0 m²/g, a β phase proportion of less than 40% and an oxygen content of 0.20 to 0.95 mass %, wherein the frequency distribution curve obtained by measuring a volume-based particle size distribution by a laser diffraction scattering method has two peaks, the peak tops of the peaks are present respectively in a range of 0.4 to 0.7 μm and in a range of 1.5 to 3.0, the ratio of frequencies of the peak tops [(the frequency of the peak top in the particle diameter range of 0.4 to 0.7 μm)/(the frequency of the peak top in the particle diameter range of 1.5 to 3.0 μm)] is from 0.5 to 1.5, and the ratio $D50/D_{BET}$ (μm/μm) of the median diameter D50 (μm) determined by the measurement of particle size distribution to the specific surface area-equivalent diameter $D_{BET}$ (μm) calculated from the specific surface area is 3.5 or more, can be first obtained. According to the method for producing a silicon nitride powder of the present invention, a silicon nitride powder having the above-described characteristic particle size distribution can be obtained even without performing pulverization or classification after firing.

The method for producing a silicon nitride powder according to the present invention is a production method of a silicon nitride powder, where an amorphous Si—N(—H)- based compound having a fairly smaller oxygen content than before is housed in a crucible and fired by heating at an unprecedentedly high temperature rising rate of 250 to 1,000° C./hour in the temperature range of 1,000 to 1,400° C. A granulated silicon nitride powder having a sharp particle size distribution has been conventionally considered to be a silicon nitride powder suitable for obtaining a dense and high-strength sintered body, and in order to prepare such a silicon nitride powder, as described in paragraphs [0050] to [0053] of Patent Document 5, in the case of producing a silicon nitride powder by housing an amorphous Si—N(—H)-based compound in a crucible and firing the compound, it has been thought necessary to use an amorphous Si—N(—H)-based compound having a large oxygen content and fire the compound at a low temperature rising rate.

In the silicon nitride powder obtained by firing an amorphous Si—N(—H)-based compound, the particle diameter and the particle morphology vary depending on, for example, the oxygen content of the amorphous Si—N(—H)-based compound, the temperature or environment at the time of firing of the compound, and the temperature rising rate during crystallization accompanied by large heat generation. Because, these factors greatly affect the crystallization mechanism of silicon nitride. For example, in the case where an amorphous Si—N(—H)-based compound is housed in a crucible and fired, if the crystallization heat generated accompanying the crystallization of silicon nitride cannot be efficiently removed, rapid crystallization of silicon nitride readily occurs. When rapid crystallization of silicon nitride occurs, the obtained silicon nitride powder is likely to become a silicon nitride powder containing a large number of fine particles, aggregated particles or coarse particles generated by columnar crystallization or needle-like crystallization, having difficulty in increasing the density of the compact, and exhibiting poor sinterability.

Even in the case of housing an amorphous Si—N(—H)-based compound in a crucible and firing the compound, when heating can be performed by lowering the temperature rising rate at the time of firing and sufficiently removing the crystallization heat, the crystallization rate can be slowed down, so that rapid crystallization of silicon nitride can be suppressed and columnar crystallization or needle-like crystallization can be prevented. However, if the temperature rising rate is low, grains easily grow and the particle diameter of the obtained silicon nitride powder tends to become large. Even if the temperature rising rate is lowered, in order to obtain a silicon nitride powder having an appropriately small particle diameter suitable for sintering, many crystal nuclei of silicon nitride need to be produced at the same time during firing, and an amorphous Si—N(—H)-based compound having a large oxygen content and generating a lot of SiO gas promoting crystal nucleus production must be used for the raw material. For these reasons, in the case of producing a silicon nitride powder by housing an amorphous Si—N(—H)-based compound in a crucible and firing the compound, it has been thought necessary to use an amorphous Si—N(—H)-based compound having a large oxygen content and fire the compound by setting the temperature rising rate to 200° C./hour at a maximum. In the case of housing an amorphous Si—N(—H)-based compound in a crucible and firing the compound, neither to use an amorphous Si—N(—H)-based compound having a small oxygen content nor to fire the amorphous Si—N(—H)-based compound by increasing the temperature rising rate has been considered adequate for obtaining silicon nitride excellent in sinterability.

The present invention has found that when an amorphous Si—N(—H)-based compound having an unprecedentedly extremely small oxygen content is used and an enormously high temperature rising rate is employed, which had been considered inappropriate as the method for producing a silicon nitride powder by housing an amorphous Si—N(—H)-based compound in a crucible and firing the compound, a silicon nitride powder excellent in the sinterability and suitable as a raw material of a silicon nitride sintered body having both high mechanical strength and high thermal conductivity can be obtained unexpectedly.

In addition, according to the method for producing a silicon nitride powder of the present invention, only by disassociation without pulverization and classification, a silicon nitride powder having properties required of the silicon nitride powder of the present invention, such as the specific surface area, oxygen content, particle size distribution and $D50/D_{BET}$, can be produced. The particles are not pulverized but only disassociated, whereby the production and procurement costs are decreased and at the same time, contamination of a foreign matter such as metal or resin into the powder or an excessive increase in the oxygen content is prevented. Contamination of a foreign matter into the silicon nitride powder tends to provide an origin for fracture of a sintered body and may reduce the mechanical strength of the sintered body, and an excessive increase in the oxygen content may reduce the thermal conductivity of the sintered body.

EXAMPLES

The present invention is described in greater detail below by referring specific examples.

Respective parameters of the silicon nitride powder according to the present invention and the silicon nitride sintered body produced using the silicon nitride powder were measured by the following methods.

(Composition Analysis Method of Amorphous Si—N(—H)-Based Compound)

The silicon (Si) content of the amorphous Si—N(—H)-based compound was measured by ICP emission analysis in conformity with "7. Total Silicon Quantification Method" of "JIS R1603 Methods for Chemical Analysis of Fine Silicon Nitride Powders for Fine Ceramics", the nitrogen (N) content was measured by a water vapor distillation/separation-neutralization titration method in conformity with "8. Total Nitrogen Quantification Method" of "JIS R1603 Methods for Chemical Analysis of Fine Silicon Nitride Powders for Fine Ceramics", and the oxygen (O) content was measured by an inert gas fusion-carbon dioxide infrared absorption method (Model TC-136 manufactured by LECO) in conformity with "10. Total Oxygen Quantification Method" of "JIS R1603 Methods for Chemical Analysis of Fine Silicon Nitride Powders for Fine Ceramics". However, in order to suppress oxidation of the amorphous Si—N(—H)-based compound, the atmosphere during sample storage until immediately before a pretreatment of the sample for measurement was set to a nitrogen atmosphere in the case of measuring the silicon/nitrogen contents by ICP emission analysis or a water vapor distillation/separation-neutralization titration method, and the atmosphere during sample storage until immediately before measurement and during measurement was set to a nitrogen atmosphere in the case of measuring the oxygen content by an infrared absorption method. The hydrogen (H) content of the amorphous Si—N(—H)-based compound was determined by calculating it, based on a stoichiometric composition, as a residue after removing silicon (Si), nitrogen (N) and oxygen (O) contents from the total amount of the amorphous Si—N(—H)-based compound. From these values, the ratio of Si, N and H was obtained, and the composition formula of the amorphous Si—N(—H)-based compound was determined.

(Methods for Calculating Specific Surface Area and BET Diameter $D_{BET}$ of Silicon Nitride Powder and Amorphous Si—N(—H)-Based Compound)

The specific surface area of each of the silicon nitride powder according to the present invention and the amorphous Si—N(—H)-based compound was measured by a BET one-point method based on nitrogen gas adsorption by using Macsorb manufactured by Mountech Co., Ltd.

The BET diameter $D_{BET}$ was determined according to the following formula (4) assuming that all particles constituting the powder are spheres having the same diameter.

$$D_{BET}=6/(\rho_s \times S) \quad (4)$$

wherein $\rho_s$ is the true density of silicon nitride (an average true density was calculated from the true density of $\alpha$-$Si_3N_4$ of 3.186 g/cm$^3$, the true density of $\beta$-$Si_3N_4$ of 3.192 g/cm$^3$, and the ratio of $\alpha$ phase and $\beta$ phase and was defined as the true density), and S is the specific surface area (m$^2$/g).

(Measuring Method of Oxygen Content of Silicon Nitride Powder)

The oxygen content of the silicon nitride powder according to the present invention was measured by an inert gas fusion-carbon dioxide infrared absorption method (Model TC-136 manufactured by LECO) in conformity with "10. Oxygen Quantification Method" of "JIS R1603 Methods for Chemical Analysis of Fine Silicon Nitride Powders for Fine Ceramics".

(Measuring Method of Particle Size Distribution of Silicon Nitride Powder)

As for the particle size distribution of the silicon nitride powder according to the present invention, a dilute solution prepared by putting the sample in an aqueous 0.2 mass % sodium hexametaphosphate solution and subjecting the solution to a dispersion treatment for 6 minutes at an output of 300 W by use of an ultrasonic homogenizer equipped with a stainless steel-made center cone having a diameter of 26 mm was measured by means of a laser diffraction/scattering particle diameter measuring apparatus (Microtrac MT3000, manufactured by Nikkiso Co., Ltd.). From the obtained frequency distribution curve and the data thereof, the particle diameter and frequency (vol %) of the peak top of the peak, the minimum value and maximum value of the particle diameter, and the median diameter (D50) were determined.

(Method for Observing Particle Morphology of Silicon Nitride Powder)

The observation of particle morphology of the silicon nitride powder was performed by scanning electron microscope (SEM) and transmission electron microscope (TEM) observations.

(Measuring Method of $\beta$ Phase Proportion of Silicon Nitride Powder)

The $\beta$ phase proportion of the silicon nitride powder according to the present invention was determined by confirming, from the X-ray diffraction data of the silicon nitride powder obtained by X-ray diffraction measurement, that the powder was composed of substantially only $\alpha$-type silicon nitride and $\beta$-type silicon nitride (a diffraction peak other than $\alpha$-type silicon nitride and $\beta$-type silicon nitride was not observed), performing Rietveld analysis to calculate $\alpha$ fraction and $\beta$ fraction of the silicon nitride, and dividing the $\beta$ fraction by the sum of $\alpha$ fraction and $\beta$ fraction. The X-ray diffraction measurement here was performed using a copper target tube and a graphite monochromator by employing a fixed-time step-scanning method of step-scanning an X-ray detector in 0.02° steps in the diffraction angle (2$\theta$) range of 15 to 80°.

(Manufacture and Evaluation Method of Sintered Body for Circuit Substrate)

A compounded powder prepared by adding, as the sintering aid, 3.5 parts by mass of yttrium oxide and 2 parts by mass of magnesium oxide to 94.5 parts by mass of the silicon nitride powder was wet mixed in a ball mill for 12 hours by using ethanol as the medium and then dried under reduced pressure. The obtained mixture was die-molded under a molding pressure of 50 MPa into a shape of 62 mm×62 mm×7.3 mm (thickness) and a shape of 12.3 mm$\varphi$× 3.2 mm (thickness) and then CIP molded under a molding pressure of 150 MPa. The obtained compact was placed in a boron nitride-made crucible and sintered at 1,900° C. for 22 hours in a pressurized nitrogen gas atmosphere of 0.8 MPa. The obtained sintered body was processed by cutting and polishing to manufacture a bending test piece of 3 mm×4 mm×40 mm in conformity with JIS R1601 and a test piece of 10 mm$\varphi$×2 mm for thermal conductivity measurement in conformity with JIS R1611. The relative density of the sintered body was measured by the Archimedes method. The room-temperature bending strength (25° C.) was measured using a universal material tester manufactured by Instron Corporation by the method in conformity with JIS R1601, and the thermal conductivity at room temperature (25° C.) was measured by the flash method in conformity with JIS R1611.

Example 1

The silicon nitride powder of Example 1 was prepared as follows. First, a toluene solution having a silicon tetrachloride concentration of 30 vol % was reacted with liquid ammonia, and the reaction solution was washed with liquid ammonia and dried to manufacture a silicon diimide powder. Subsequently, the obtained silicon diimide powder was heated and decomposed by using a rotary kiln to obtain an amorphous Si—N(—H)-based compound. In the heating and decomposition, the thermal decomposition temperature of the silicon diimide powder was 1,200° C., the gas introduced at the time of thermal decomposition was an air-nitrogen mixed gas having an oxygen concentration of 0.5 vol %, the flow rate of the gas was 72 liter/hour per 1 kg of the silicon diimide powder, and the silicon diimide powder was supplied to the rotary kiln while maintaining the rate at 25 to 35 kg/hour. In the obtained amorphous Si—N (—H)-based compound according to Example 1, as shown in Table 1, the specific surface area was 302 m$^2$/g, and the oxygen content was 0.16 mass %. In addition, the amorphous Si—N(—H)-based compound according to Example 1 was an amorphous Si—N(—H)-based compound represented by the composition formula $Si_6N_{8.04}H_{0.12}$, i.e., a compound where in the formula $Si_6N_{2x}(NH)_{12-3x}$, x is 3.96.

The obtained amorphous Si—N(—H)-based compound was disassociated as follows by using a continuous vibration mill. The obtained amorphous Si—N(—H)-based compound was supplied to a pot filled with balls of silicon nitride sintered body, of which inner wall surface was lined with a resin, while maintaining the rate at 25 to 35 kg/hour in a nitrogen atmosphere and disassociated until reaching a state of not containing coarse aggregated particles having a particle diameter of 50 μm or more. The particle diameter as used herein is a particle diameter of the volume particle size distribution when measured by the laser diffraction scattering method. The disassociated amorphous Si—N(—H)-based compound was molded into an almond shape of from 6 mm (thickness)×8 mm (minor axis diameter)×12 mm (major axis diameter) to 8 mm (thickness)×12 mm (minor axis diameter)×18 mm (major axis diameter) in a nitrogen atmosphere by using briquette machine, Model BGS-IV, manufactured by Sintokogio, Ltd.

About 1.0 kg of the obtained almond-shaped molded product of the amorphous Si—N(—H)-based compound was packed at a packing density of 0.30 g/mL into a box-type graphite-made vessel (hereinafter, referred to as A-type vessel) having an inside dimension of each side of the bottom being 270 mm and the height being 270 mm, in which square plates each having a side length of 270 mm and a thickness of 6 mm were provided in the interior at intervals of 40 mm to form a grid pattern and the surface was coated with silicon carbide, and fired in a nitrogen atmosphere by using a batch firing furnace (high-temperature atmosphere furnace manufactured by Fuji Denpa Kogyo K.K.; in Table 1, simply denoted by "batch"). The firing was performed by heating at a temperature rising rate of 1,000° C./hour up to 1,000° C. and at 250° C./hour from 1,000° C. up to 1,400° C. and holding at 1,400° C. for 1 hour and thereafter, the temperature was lowered. The silicon nitride powder after firing taken out from the crucible was housed in a pot filled with silicon nitride sintered body-made balls, of which inner wall surface was lined with a resin, in an air atmosphere and disassociated by means of a batch-type vibration mill until reaching a state of not containing aggregated particles having a particle diameter of 30 µm or more, whereby the silicon nitride powder of Example 1 was obtained.

The physical values of the silicon nitride powder of Example 1 as measured by the methods described above are shown together with the production conditions in Table 1. In the silicon nitride powder of Example 1, the specific surface area was 5.0 m$^2$/g, the oxygen content was 0.23 mass %, the β phase proportion was 31%, and the frequency distribution curve of particle size distribution had two peaks. The peak tops thereof were at 0.63 µm and 3.00 µm, and the ratio of frequencies of peak tops [(the frequency of the peak top in the particle diameter range of 0.4 to 0.7 µm)/(the frequency of the peak top in the particle diameter range of 1.5 to 3.0 µm)] was 1.2. The minimum value of the particle diameter determined by the measurement of particle size distribution was 0.24 µm, and the maximum value was 24 µm.

In addition, $D50/D_{BET}$ (µm/µm) was 3.66, and the ratio ΔDp/D50 of (the difference ΔDp between particle diameters of respective peak tops) to (the median diameter D50), as calculated by dividing the difference ΔDp in the particle diameter between the peak top in the particle diameter range of 1.5 to 3.0 µm and the peak top in the particle diameter range of 0.4 to 0.7 µm by D50, was 1.72.

A compounded powder prepared by adding, as the sintering aid, 3.5 parts by mass of yttrium oxide and 2 parts by mass of magnesium oxide to 94.5 parts by mass of the silicon nitride powder of Example 1 was wet mixed in a ball mill for 12 hours by using ethanol as the medium and then dried under reduced pressure. The obtained mixture was die-molded using a uniaxial press machine under a molding pressure of 50 MPa into a square plate shape of 62 mm×62 mm×7.3 mm (thickness) and a disc shape of 12.3 mm (diameter)×3.2 mm (thickness) and then CIP molded under a molding pressure of 150 MPa. The obtained compact was placed in a boron nitride-made crucible and sintered by heating up to 1,900° C. and holding at 1,900° C. for 22 hours in a pressurized nitrogen gas atmosphere of 0.8 MPa. The obtained silicon nitride sintered body was processed by cutting and polished to manufacture a bending test piece of 3 mm×4 mm×40 mm in conformity with JIS R1601 and a test piece of 10 mmφ×2 mm for thermal conductivity measurement in conformity with JIS R1611.

Using the obtained test pieces, the measurement of relative density by the Archimedes method, the measurement of bending strength at room temperature (25° C.), and the measurement of thermal conductivity at room temperature (25° C.) were performed by the methods described above. The results are shown in Table 1. The relative density of the sintered body was 97.3%, the bending strength at room temperature was 1,015 MPa, and the thermal conductivity at room temperature was 103 W/mK, revealing that the silicon nitride sintered body obtained using the silicon nitride powder of Example 1 was dense and had both high mechanical strength and high thermal conductivity.

Examples 2 to 12

The silicon nitride powders of Examples 2 to 12 were produced as follows. The same silicon diimide powder as in Example 1 was heated and decomposed using the same rotary kiln furnace as in Example 1. The amorphous Si—N (—H)-based compounds according to Examples 2 to 12 having a specific surface area of 302 to 789 m$^2$/g and an oxygen content of 0.15 to 0.50 mass %, shown in Table 1, were produced by heating and decomposing the silicon diimide powder by the same method as in Example 1 except that the thermal decomposition temperature of the silicon diimide powder, the oxygen concentration of the air-nitrogen mixed gas introduced at the time of thermal decomposition, and the flow rate of the gas were adjusted respectively in the range of 600 to 1,200° C., in the range of 0.5 to 4 vol %, and in the range of 35 to 150 liter/hour per 1 kg of the silicon diimide powder. Here, x in the composition formula $Si_6N_{2x}(NH)_{12-3x}$ of the amorphous Si—N(—H)-based compounds according to Examples 2 to 12 was, starting from Example 2, 3.96, 3.94, 3.94, 2.40, 2.40, 2.38, 2.38, 3.51, 3.51, 3.03, and 3.03.

Each of the obtained amorphous Si—N(—H)-based compounds was disassociated by the same method as in Example 1 and molded into the same almond shape as in Example 1 by the same method as in Example 1. The obtained almond-shaped molded product of the amorphous Si—N(—H)-based compound was fired, in Examples 2 to 12, by packing it into the following two kinds of graphite-made vessels. One is a box-type graphite-made vessel (hereinafter referred to as B-type vessel) having an inside dimension of each side of the bottom being 380 mm and the height being 380 mm, in which graphite-made square plates each having a side length of 380 mm and a thickness of 8 mm are provided in the interior at intervals of 40.5 mm to form a grid pattern, and another is a bottomed cylindrical graphite-made vessel (hereinafter referred to as C-type vessel) having an inside dimension of the diameter of the bottom being 360 mm and the height being 360 mm, in which three kinds of graphite-made cylinders, i.e., a cylinder having an inner diameter of 78 mm, a height of 360 mm and a thickness of 8 mm, a cylinder having an inner diameter of 172 mm, a height of 360 mm and a thickness of 8 mm, and a cylinder having an inner diameter of 226 mm, a height of 360 mm and a thickness of 8 mm, are concentrically provided in the interior.

Figure 2:
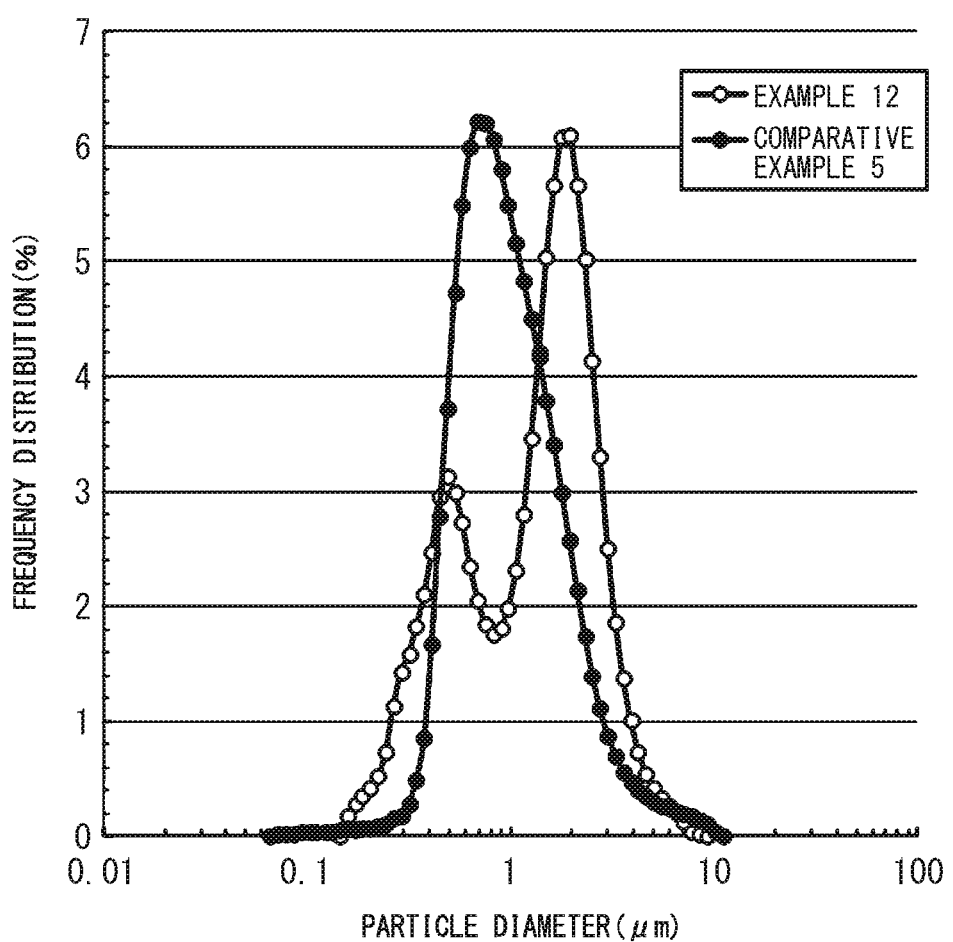
FIG. 2 A view illustrating the frequency distribution curves obtained by measuring the volume-based particle size distribution by a laser diffraction scattering method on the silicon nitride powders of Example 12 and Comparative Example 5.

The amorphous Si—N(—H)-based compound was packed at a packing density of 0.25 to 0.50 g/mL into the graphite-made vessel shown in Table 1 and fired in a nitrogen atmosphere by using a pusher furnace manufactured by Tokai Konetsu Kogyo Co., Ltd. In the firing, by adjusting the temperature in each zone of the pusher furnace and the conveyance speed of the crucible, the temperature was raised at a rate of 250 to 1,000° C./hour from 1,000° C. up to 1,400° C., subsequently raised to the predetermined holding temperature (shown as Firing Temperature in Table 1) except for a case where the holding temperature (firing temperature) was 1,400° C., and further held at the firing temperature of 1,400 to 1,700° C. for 0.25 to 2.0 hours and thereafter, the temperature was lowered. The silicon nitride powder after firing taken out from the crucible was disassociated as follows by using a continuous vibration mill. The silicon nitride powder after firing was supplied to a pot filled with balls of silicon nitride sintered body, of which inner wall surface is lined with a resin, in an air atmosphere while maintaining the rate at 25 to 35 kg/hour, until reaching a state of not containing aggregated particles having a particle diameter of 30 μm or more. In this way, the silicon nitride powders of Example 2 to 12 were obtained. The physical values of each of the silicon nitride powders of Examples 2 to 12 as measured by the methods described above are shown together with the production conditions in Table 1. In FIG. 2, the frequency distribution curve of particle size distribution of the silicon nitride powder of Example 12 is illustrated together with that of the later-described silicon nitride power of Comparative Example 5.

It was confirmed from FIG. 2 that the frequency distribution curve of the silicon nitride powder of Comparative Example 5 has only one peak, whereas the silicon nitride powder of Example 12 has two peaks, the particle diameters of peak tops thereof are 0.49 μm (in the range of 0.4 to 0.7 μm) and 1.94 μm (in the range of 1.5 to 3.0 μm), and the ratio of frequencies of the peak tops [(the frequency of the peak top in the particle diameter range of 0.4 to 0.7 μm)/(the frequency of the peak top in the particle diameter range of 1.5 to 3.0 μm)] was 0.5 (in the range of 0.5 to 1.5).

In the silicon nitride powders of Examples 2 to 12, the specific surface area was from 4.0 to 8.9 m$^2$/g, the oxygen content was from 0.20 to 0.94 mass %, the β phase proportion was from 5 to 35%, the peak top of the frequency distribution curve of particle size distribution is in the range of 0.45 to 0.69 μm and in the range of 1.50 to 3.00 μm, and the ratio of frequencies of peak tops [(the frequency of the peak top in the particle diameter range of 0.4 to 0.7 μm)/(the frequency of the peak top in the particle diameter range of 1.5 to 3.0 μm)] was from 0.5 to 1.5. In addition, $D50/D_{BET}$ (μm/μm) was from 3.74 to 5.25, and the ratio ΔDp/D50 of (the difference ΔDp between particle diameters of respective peak tops) to (the median diameter D50), as calculated by dividing the difference ΔDp between the particle diameter at the peak top in the particle diameter range of 1.5 to 3.0 μm and the particle diameter at the peak top in the particle diameter range of 0.4 to 0.7 μm by D50, was from 1.20 to 2.01.

Similarly to Example 1, a compounded powder prepared by adding, as the sintering aid, 3.5 parts by weight of yttrium oxide and 2.0 parts by weight of magnesium oxide to 94.5 parts by mass of each of the silicon nitride powders of Examples 2 to 12 was wet mixed in a ball mill for 12 hours by using ethanol as the medium and then dried under reduced pressure. The obtained mixture was die-molded using a uniaxial press machine and further CIP molded by the same method as in Example 1. The obtained compact was sintered in the same manner as in Example 1. The obtained sintered body was processed by cutting and polished to manufacture a bending test piece of 3 mm×4 mm×40 mm in conformity with JIS R1601 and a test piece of 10 mmφ×2 mm for thermal conductivity measurement in conformity with JIS R1611.

Using the obtained test pieces, the measurement of relative density by the Archimedes method, the measurement of room-temperature bending strength, and the measurement of thermal conductivity at room temperature were performed in the same manner as in Example 1. The results are shown in Table 1. The relative density of the sintered body was from 96.5 to 98.8%, the bending strength at room temperature (25° C.) was from 946 to 1,220 MPa, and the thermal conductivity at room temperature (25° C.) was from 100 to 122 W/mK, revealing that the silicon nitride sintered body obtained using the silicon nitride powders of Examples 2 to 12 was, similarly to Example 1, dense and had both high mechanical strength and high thermal conductivity.

Comparative Example 1

The silicon nitride powder of Comparative Example 1 was prepared as follows. The same silicon diimide powder as in Example 1 was heated and decomposed using the same rotary kiln furnace as in Example 1. An amorphous Si—N (—H)-based compound having a specific surface area of 302 m$^2$/g and an oxygen content of 0.13 mass %, shown in Table 1, was obtained by heating and decomposing the silicon diimide powder by the same method as in Example 1 except that the flow rate of the air-nitrogen mixed gas having an oxygen concentration of 0.5 vol % introduced at the time of thermal decomposition was changed to 38 liter/hour per 1 kg of the silicon diimide powder. Here, x in the composition formula $Si_6N_{2x}(NH)_{12-3x}$ of the amorphous Si—N(—H)-based compound according to Comparative Example 1 was 3.96.

The obtained amorphous Si—N(—H)-based compound was disassociated by the same method as in Example 1 and molded into the same almond shape as in Example 1 by the same method as in Example 1. About 1.0 kg of the obtained almond-shaped molded product of the amorphous Si—N(—H)-based compound was packed into the same A-type vessel as in Example 1 similarly at a packing density of 0.30 g/mL and fired in a nitrogen atmosphere by using the high-temperature atmosphere furnace manufactured by Fuji Denpa Kogyo K.K. After heating at a temperature rising rate of 1,000° C./hour up to 1,000° C. and at 200° C./hour up to 1,400° C. and holding at 1,400° C. for 1 hour, the temperature was lowered. The silicon nitride powder after firing taken out from the crucible was disassociated by the same method as in Example 1 to obtain the silicon nitride powder of Comparative Example 1.

The physical values of the silicon nitride powder of Comparative Example 1 as measured by the methods described above are shown together with the production conditions in Table 1. In the silicon nitride powder of Comparative Example 1, the specific surface area was 3.8 m$^2$/g, the oxygen content was 0.17 mass %, the β phase proportion was 36%, and the frequency distribution curve of particle size distribution had one peak. In addition, $D50/D_{BET}$ (μm/μm) was 3.73.

Using the obtained silicon nitride powder of Comparative Example 1, a silicon nitride sintered body was produced by the same method as in Example 1. The obtained silicon nitride sintered body was processed by cutting and polished to manufacture a bending test piece of 3 mm×4 mm×40 mm in conformity with JIS R1601 and a test piece of 10 mmφ×2 mm for thermal conductivity measurement in conformity with JIS R1611.

Using the obtained test pieces, the measurement of relative density by the Archimedes method, the measurement of bending strength at room temperature (25° C.), and the measurement of thermal conductivity at room temperature (25° C.) were performed in the same manner as in Example 1. The results are shown in Table 1. The relative density of the sintered body was 85.6%, the room-temperature bending strength was 574 MPa, and the thermal conductivity at room temperature was 83 W/mK.

Comparative Examples 2 to 4

The silicon nitride powders of Comparative Examples 2 to 4 were prepared as follows. The same silicon diimide powder as in Example 1 was heated and decomposed using the same rotary kiln furnace as in Example 1. The amorphous Si—N(—H)-based compounds for use in Comparative Examples 2 to 4 having a specific surface area of 306 to 480 m²/g and an oxygen content of 0.14 to 0.80 mass %, shown in Table 1, were produced by heating and decomposing the silicon diimide powder by the same method as in Example 1 except that the thermal decomposition temperature, the oxygen concentration of the air-nitrogen mixed gas introduced at the time of thermal decomposition, and the flow rate of the gas were adjusted respectively in the range of 900 to 1,200° C., in the range of 1 to 4 vol %, and in the range of 50 to 250 liter/hour per 1 kg of the silicon diimide powder. Here, x in the composition formula $Si_6N_{2x}(NH)_{12-3x}$ of the amorphous Si—N(—H)-based compounds according to Comparative Examples 2 to 4 was, starting from Comparative Example 2, 3.88, 3.31, and 3.96.

Each of the obtained amorphous Si—N(—H)-based compounds shown in Table 1 was disassociated by the same method as in Example 1 and molded into the same almond shape as in Example 1 by the same method as in Example 1. The obtained almond-shaped molded product of the amorphous Si—N(—H)-based compound was supplied to a rotary kiln furnace manufactured by Motoyama K.K. equipped with an SiC-made furnace tube and fired. In the SiC-made furnace tube of the rotary kiln, a heating zone having a total length of 1,050 mm and being divided into six equal parts was provided, and at the time of firing, the temperature was controlled such that the temperature near the outer wall of the furnace tube becomes 1,100° C.-1,210° C.-1,320° C.-(1,420 to 1,500° C.)-(1,420 to 1,500° C.)-(1,420 to 1,500) in respective central parts of first to sixth zones provided from the end on the raw material inlet side toward the fired product discharge side of the heating zone. The furnace tube inclined by 0.5 to 2° from was rotated at a rotation speed of 0.5 to 2 rpm and while flowing a nitrogen gas from the inlet side at a flow rate of 8 liter/min, the almond-shaped molded product of the amorphous Si—N(—H)-based compound was supplied at 0.5 to 3 kg/hour and thereby fired at a temperature rising rate of 200 to 1,000° C./hour in the temperature range of 1,100 to 1,420° C. and at a firing temperature of 1,420 to 1,500° C. to obtain a silicon nitride powder. The silicon nitride powder after firing taken out was disassociated by the same method as in Example 1 to obtain the silicon nitride powders of Comparative Examples 2 to 4.

The physical values of each of the silicon nitride powders of Comparative Examples 2 to 4 as measured by the methods described above are shown together with the production conditions in Table 1. In the silicon nitride powders of Comparative Examples 2 to 4, the specific surface area was from 7.2 to 20.6 m²/g, the oxygen content was from 0.20 to 1.32 mass %, the β phase proportion was from 6 to 45%, and the frequency distribution curve of particle size distribution had two peaks in Comparative Examples 2 and 3 and one peak in Comparative Example 4. The frequency distribution curve of each of Comparative Examples 2 and 3 had two peaks, but the particle diameters at the peak tops of Comparative Example 2 were 0.34 μm and 13.1 μm, and the particle diameters at the peak tops of Comparative Example 3 were 0.75 μm and 10.1 μm, that is, the particle diameters of all peak tops were different from the range of the particle diameter at the peak top of the present invention. The particle diameter at the peak top of Comparative Example 4 was 0.82 μm. In addition, $D50/D_{BET}$ (μm/μm) was from 4.85 to 10.39.

Using each of the obtained silicon nitride powders of Comparative Examples 2 to 4, a silicon nitride sintered body was produced by the same method as in Example 1. The obtained silicon nitride sintered body was processed by cutting and polished to manufacture a bending test piece of 3 mm×4 mm×40 mm in conformity with JIS R1601 and a test piece of 10 mmφ×2 mm for thermal conductivity measurement in conformity with JIS R1611.

Using the obtained test pieces, the measurement of relative density by the Archimedes method, the measurement of bending strength at room temperature, and the measurement of thermal conductivity at room temperature were performed by the methods described above, similarly to Example 1. The results are shown in Table 1. The relative density of the sintered body was from 97.2 to 98.3%, the bending strength at room temperature was from 575 to 658 MPa, and the thermal conductivity at room temperature was from 123 to 133 W/mK.

Comparative Examples 5 to 21

The silicon nitride powders of Comparative Examples 5 to 15 were prepared as follows. The same silicon diimide powder as in Example 1 was heated and decomposed using the same rotary kiln furnace as in Example 1. The amorphous Si—N(—H)-based compounds for use in Comparative Examples 5 to 21 having a specific surface area of 243 to 822 m²/g and an oxygen content of 0.10 to 0.85 mass %, shown in Table 1, were produced by heating and decomposing the silicon diimide powder in the same manner as in Example 1 except that the thermal decomposition temperature, the oxygen concentration of the air-nitrogen mixed gas introduced at the time of thermal decomposition, and the flow rate of the gas were adjusted respectively in the range of 450 to 1,225° C., in the range of 0 to 4 vol %, and in the range of 35 to 265 liter/hour per 1 kg of the silicon diimide powder. Here, x in the composition formula $Si_6N_{2x}(NH)_{12-3x}$ of the amorphous Si—N(—H)-based compounds according to Comparative Examples 5 to 21 was, starting from Comparative Example 5, 3.53, 3.37, 2.58, 3.53, 3.37, 3.96, 3.37, 2.30, 3.98, 3.37, 3.38, 2.39, 2.40, 3.37, 2.40, 3.03, and 3.03.

Each of the obtained amorphous Si—N(—H)-based compounds shown in Table 1 was disassociated by the same method as in Example 1 and molded into the same almond shape as in Example 1 by the same method as in Example 1. The obtained almond-shaped molded product of the amorphous Si—N(—H)-based compound was packed at a packing density of 0.23 to 0.47 g/mL into the B-type or C-type graphite-made vessel and fired in a nitrogen atmosphere by using a pusher furnace manufactured by Tokai Konetsu Kogyo Co., Ltd. In the firing, by adjusting the temperature in each zone of the pusher furnace and the conveyance speed of the crucible, the temperature was raised at a rate of 25 to 1,200° C./hour from 1,000° C. up to 1,400° C. and in case where the holding temperature (firing temperature) was 1,350° C., from 1,000 up to 1,350° C., subsequently raised to the predetermined holding temperature except for a case where the holding temperature was 1,350° C. or 1,400° C., and held at a temperature of 1,350 to 1,750° C. for 0.21 to 2.5 hours and thereafter, the temperature was lowered.

The silicon nitride powder taken out after firing was disassociated by the same method as in Examples 2 to 12 to obtain the silicon nitride powders of Comparative Examples 5 to 21. The physical properties of each of the silicon nitride powders of Comparative Examples 5 to 21 as measured by the methods described above are shown together with the production conditions in Table 1. In FIG. 2, the frequency distribution curve of particle size distribution of the silicon nitride powder of Comparative Example 5 is illustrated together with that of the later-described silicon nitride power of Example 12.

It was confirmed from FIG. 2 that unlike the silicon nitride powder of Example 12, the frequency distribution curve of the silicon nitride powder of Comparative Example 5 has only one peak. In the silicon nitride powders of Comparative Examples 5 to 21, the specific surface area was from 2.8 to 13.4 m²/g, the oxygen content was from 0.16 to 1.30 mass %, the β phase proportion was from 2 to 55%, and the frequency distribution curve of particle size distribution had one peak in Comparative Examples 5 to 10, 13 and 15, and two peaks in Comparative Examples 11, 12, 14 and 16 to 21. The frequency distribution curve of particle size distribution of Comparative Examples 11, 12 and 16 to 21 had two peaks, but the particle diameter at the peak tops of Comparative Examples 12 and 16 to 19 were, starting from Comparative Example 12, 0.69 μm and 3.27 μm, 0.27 μm and 2.75 μm, 0.89 μm and 3.00 μm, 0.45 μm and 1.38 μm, and 0.63 μm and 3.27 μm, revealing that the diameter of one peak top was different from the range of the present invention, and the particle diameters at the peak tops of Comparative Example 14 were 1.16 μm and 6.54 μm, revealing that the particle diameters of both peak tops were different from the ranges of the present invention. The particle diameters at the peak tops of Comparative Examples 11, 20 and 21 were 0.58 μm and 1.16 μm, 0.53 μm and 2.52 μm, and 0.49 μm and 2.52 μm, but the ratio of frequencies of the peak tops [(the frequency of the peak top in the particle diameter range of 0.4 to 0.7 μm)/(the frequency of the peak top in the particle diameter range of 1.5 to 3.0 μm)] was 3.3, 0.3 and 1.7 and different from the range of the present invention. In addition, $D50/D_{BET}$ (μm/μm) was from 3.24 to 8.01, and the ratio ΔDp/D50 of the difference between respective peak tops to the median diameter, as calculated by dividing the difference ΔDp between the particle diameter at the peak top in the particle diameter range of 1.5 to 3.0 μm and the particle diameter at the peak top in the particle diameter range of 0.4 to 0.7 μm by D50, was 1.43 and 1.72 respectively in Comparative Examples 20 and 21 having a peak top in those ranges.

Using each of the obtained silicon nitride powders of Comparative Examples 5 to 21, a silicon nitride sintered body was produced by the same method as in Example 1. The obtained silicon nitride sintered body was processed by cutting and polished to manufacture a bending test piece of 3 mm×4 mm×40 mm in conformity with JIS R1601 and a test piece of 10 mmφ×2 mm for thermal conductivity measurement in conformity with JIS R1611.

Using the obtained test pieces, the measurement of relative density by the Archimedes method, the measurement of bending strength at room temperature, and the measurement of thermal conductivity at room temperature were performed by the methods described above, similarly to Example 1. The results are shown in Table 1. The relative density of the sintered body was from 83.0 to 95.3%, the bending strength at room temperature was from 486 to 952 MPa, and the thermal conductivity at room temperature was from 52 to 103 W/mK, but a sintered body having a bending strength at room temperature of 900 MPa or more and a thermal conductivity at room temperature of 100 W/mK or more was not obtained.

Comparative Examples 22 and 23

Grade HQ10 produced by SKW, which is commercially available, was used as the silicon nitride powder of Comparative Example 22, and Grade SQ produced by Alzchem, which is commercially available, was used as the silicon nitride powder of Comparative Example 23.

The physical values of each of the silicon nitride powders of Comparative Examples 22 and 23 are shown in Table 1. In the silicon nitride powder of Comparative Example 22, the specific surface area was 5.4 m²/g, the oxygen content was 0.62 mass %, the β phase proportion was 12 mass %, the particle diameters at the peak tops of the frequency distribution curve of particle size distribution were 0.67 μm and 1.98 μm, and the ratio of frequencies of the peak tops [(the frequency of the peak top in the particle diameter range of 0.4 to 0.7 μm)/(the frequency of the peak top in the particle diameter range of 1.5 to 3.0 μm)] was 1.5, but $D50/D_{BET}$ was 3.30, which was different from the range of the present invention. In the silicon nitride powder of Comparative Example 23, the specific surface area was 3.7 m²/g, the oxygen content was 0.51 mass %, the particle diameters at the peak tops of the frequency distribution curve of particle size distribution were 0.69 μm and 2.75 μm, the ratio of frequencies of the peak tops [(the frequency of the peak top in the particle diameter range of 0.4 to 0.7 μm)/(the frequency of the peak top in the particle diameter range of 1.5 to 3.0 μm)] was 2.8, and $D50/D_{BET}$ was 3.88, but the specific surface area was 3.7 m²g and the β phase proportion was 46 mass %, which were different from the ranges of the present invention. The ratio ΔDp/D50 of (the difference between particle diameters of respective peak tops) to (the median diameter), as determined by calculating ΔDp/D50 by dividing the difference ΔDp between the particle diameter at the peak top in the particle diameter range of 1.5 to 3.0 μm and the particle diameter at the peak top in the particle diameter range of 0.4 to 0.7 μm by D50, was 1.14 in Comparative Example 22 having a peak top in those ranges and 1.04 in Comparative Example 23.

Using each of the obtained silicon nitride powders of Comparative Examples 22 and 23, a silicon nitride sintered body was produced by the same method as in Example 1. The obtained silicon nitride sintered body was processed by cutting and polished to manufacture a bending test piece of 3 mm×4 mm×40 mm in conformity with JIS R1601 and a test piece of 10 mmφ×2 mm for thermal conductivity measurement in conformity with JIS R1611.

Using the obtained test pieces, the measurement of relative density by the Archimedes method, the measurement of bending strength at room temperature, and the measurement of thermal conductivity at room temperature were performed by the methods described above, similarly to Example 1. The results are shown in Table 1. The relative density of the sintered body was 88.3 and 87.2%, the bending strength at room temperature was 603 and 554 MPa, and the thermal conductivity at room temperature was 88 and 71 W/mK.

Comparative Example 24

Three kinds of silicon nitride powders differing in the specific surface area, D50, etc., i.e., in the descending order of specific surface area, Powder A, Powder B and Powder C, were blended to prepare the silicon nitride powder of Comparative Example 24. Powder A used was UBE-SN-E05 produced by Ube Industries, Ltd. (specific surface area: 5.0 m$^2$/g, oxygen content: 0.90 mass %, β phase proportion: 1.7 mass %, D10: 0.471 µm, D50: 0.736 µm, D90: 1.725 µm).

Powder B was prepared as follows. 0.001 Parts by weight of a silicon nitride powder having a specific surface area of 16.5 m$^2$/g, an oxygen content of 2.1 mass %, and a β phase proportion of 95 mass % was mixed with 100 parts by mass of the amorphous Si—N(—H)-based compound of Example 5, and the compound was disassociated by the same method as that for the amorphous Si—N(—H)-based compound of Example 1 and molded into the same almond shape as in Example 1 by the same method as in Example 1. About 3.0 kg of the obtained almond-shaped molded product of the amorphous Si—N(—H)-based compound was packed at a packing density of 0.30 g/mL into the C-type vessel and fired in a nitrogen atmosphere by using a batch firing furnace (high-temperature atmosphere furnace manufactured by Fuji Denpa Kogyo K.K.). In the firing, the temperature was raised at a temperature rising rate of 1,000° C./hour from room temperature up to 1,000° C. and at 1,000° C./hour from 1,000° C. up to 1,150° C., held at 1,150° C. for 0.5 hours, raised at a temperature rising rate of 25° C./hour from 1,150° C. up to 1,200° C., at 10° C./hour from 1,200° C. up to 1,280° C., at 20° C./hour from 1,280 up to 1,320° C., at 100° C./hour from 1,320° C. up to 1,370° C., and at 270° C./hour from 1,370° C. up to 1,550° C., and held at 1,550° C. for 1 hour and thereafter, the temperature was lowered. The silicon nitride powder after firing taken out from the crucible was disassociated by the same method as in Example 1 to obtain Powder B (specific surface area: 0.82 m$^2$/g, oxygen content: 0.20 mass %, β phase proportion: 36%, D10: 2.664 µm, D50: 3.947 µm, D90: 6.281 µm).

Powder C was prepared as follows. Powder C (specific surface area: 0.24 m$^2$/g, oxygen content: 0.10 mass %, β phase proportion: 45%, D10: 7.906 µm, D50: 11.06 µm, D90: 16.63 µm) was obtained by performing firing and disassociation by the same method as that for Powder B except that 0.0001 parts by weight of a silicon nitride powder having a specific surface area of 16.5 m$^2$/g, an oxygen content of 2.1 mass %, and a β phase proportion of 95 mass % was added to and mixed with 100 parts by mass of the amorphous Si—N(—H)-based compound of Example 5.

The silicon nitride powder of Comparative Example 24 was prepared by mixing Powder A, Powder B and Powder C in a mass ratio of Powder A:Powder B:Powder C=30:65:5. The physical values of the silicon nitride powder of Comparative Example 24 are shown together with the production conditions in Table 1. In the silicon nitride powder of Comparative Example 24, the specific surface area was 2.0 m$^2$/g, the oxygen content was 0.41 mass %, the β phase proportion was 26%, and the frequency distribution curve of particle size distribution had two peaks, but the peak tops thereof were at 0.69 µm and 3.89 µm. In addition, D50/D$_{BET}$ (µm/µm) was 3.37.

Using the obtained silicon nitride powder of Comparative Example 24, a silicon nitride sintered body was produced by the same method as in Example 1. The obtained silicon nitride sintered body was processed by cutting and polished to manufacture a bending test piece of 3 mm×4 mm×40 mm in conformity with JIS R1601 and a test piece of 10 mmφ×2 mm for thermal conductivity measurement in conformity with JIS R1611.

Using the obtained test pieces, the measurement of relative density by the Archimedes method, the measurement of bending strength at room temperature, and the measurement of thermal conductivity at room temperature were performed by the methods described above, similarly to Example 1. The results are shown in Table 1. The relative density of the sintered body was 82.1%, the bending strength at room temperature was 496 MPa, and the thermal conductivity at room temperature was 55 W/mK.

As demonstrated above, it was understood that when a silicon nitride powder obtained by the method for producing a silicon nitride powder according to the present invention is used as the raw material and sintered, a silicon nitride sintered body having a thermal conductivity of 100 W/m·K or more at room temperature and nevertheless having a bending strength of 900 MPa or more at room temperature is obtained.

TABLE 1

| | Amorphous Si—N(—H)-Based Compound | | Firing Conditions | | | | | |
|---|---|---|---|---|---|---|---|---|
| | Specific Surface Area (m$^2$/g) | Oxygen Content (mass %) | Firing Furnace | Graphite-Made Vessel | Packing Density (g/mL) | Temperature Rising Rate <1000-1400° C.> (° C./hr) | Firing Temperature (° C.) | Holding Time (hr) |
| Example 1 | 302 | 0.16 | batch | A-type | 0.30 | 250 | 1400 | 1.0 |
| Example 2 | 302 | 0.16 | pusher | B-type | 0.45 | 1000 | 1400 | 0.5 |
| Example 3 | 302 | 0.48 | | C-type | 0.45 | 350 | 1550 | 1.43 |
| Example 4 | 302 | 0.48 | | | 0.50 | 850 | 1550 | 0.59 |
| Example 5 | 789 | 0.15 | | B-type | 0.25 | 250 | 1400 | 2.0 |
| Example 6 | 789 | 0.15 | | | 0.25 | 1000 | 1400 | 0.25 |
| Example 7 | 789 | 0.50 | | | 0.28 | 300 | 1600 | 1.67 |
| Example 8 | 789 | 0.50 | | | 0.28 | 950 | 1700 | 0.26 |
| Example 9 | 446 | 0.46 | | | 0.42 | 450 | 1600 | 1.1 |
| Example 10 | 446 | 0.46 | | | 0.42 | 350 | 1550 | 1.07 |
| Example 11 | 662 | 0.48 | | | 0.38 | 350 | 1550 | 1.07 |
| Example 12 | 662 | 0.48 | | | 0.38 | 600 | 1550 | 0.83 |
| Com. Ex. 1 | 302 | 0.13 | batch | A-type | 0.30 | 200 | 1400 | 1.0 |
| Com. Ex. 2 | 311 | 0.80 | rotary | — | — | 1000 | 1500 | 0.18 |
| Com. Ex. 3 | 480 | 0.45 | kiln | | | 950 | 1420 | 0.19 |

TABLE 1-continued

| | | | | | | | | |
|---|---|---|---|---|---|---|---|---|
| Com. Ex. 4 | 306 | 0.14 | | | | 250 | 1500 | 0.72 |
| Com. Ex. 5 | 423 | 0.85 | pusher | B-type | 0.40 | 100 | 1550 | 1.25 |
| Com. Ex. 6 | 478 | 0.48 | | | 0.38 | 25 | 1550 | 2.5 |
| Com. Ex. 7 | 737 | 0.12 | | | 0.28 | 200 | 1440 | 1.25 |
| Com. Ex. 8 | 423 | 0.85 | | C-type | 0.40 | 200 | 1550 | 1.25 |
| Com. Ex. 9 | 478 | 0.55 | | B-type | 0.38 | 1200 | 1700 | 0.21 |
| Com. Ex. 10 | 302 | 0.10 | | | 0.45 | 1200 | 1600 | 0.42 |
| Com. Ex. 11 | 478 | 0.35 | | | 0.38 | 250 | 1350 | 1.25 |
| Com. Ex. 12 | 822 | 0.15 | | | 0.23 | 250 | 1550 | 1.25 |
| Com. Ex. 13 | 243 | 0.50 | | | 0.47 | 800 | 1600 | 0.31 |
| Com. Ex. 14 | 478 | 0.35 | | | 0.38 | 350 | 1750 | 2.0 |
| Com. Ex. 15 | 478 | 0.15 | | | 0.37 | 1200 | 1500 | 0.42 |
| Com. Ex. 16 | 790 | 0.20 | | | 0.41 | 230 | 1550 | 1.00 |
| Com. Ex. 17 | 789 | 0.15 | | | 0.25 | 25 | 1600 | 1.00 |
| Com. Ex. 18 | 478 | 0.55 | | | 0.38 | 800 | 1500 | 1.25 |
| Com. Ex. 19 | 789 | 0.15 | | | 0.25 | 1200 | 1600 | 1.50 |
| Com. Ex. 20 | 662 | 0.48 | | | 0.38 | 25 | 1550 | 1.00 |
| Com. Ex. 21 | 662 | 0.48 | | | 0.38 | 1200 | 1450 | 1.00 |
| Com. Ex. 22 | commercially available silicon nitride powder (Grade HQ10 produced by SKW) | | | | | | | |
| Com. Ex. 23 | commercially available silicon nitride powder (Grade SQ produced by Alzchem) | | | | | | | |
| Com. Ex. 24 | silicon nitride powder prepared by blending | | | | | | | |

Silicon Nitride Powder

| | | | | | Measurement Results of Particle Size Distribution | | | |
|---|---|---|---|---|---|---|---|---|
| | Specific Surface Area (m$^2$/g) | $D_{BET}$ (μm) | Oxygen Content (mass %) | β Phase Proportion (mass %) | Particle Diameter of Peak Top at Smaller Particle Diameter in Case of Two Peaks, or Particle Diameter of Peak Top in Case of One Peak (μm) | Particle Diameter of Peak Top of Peak at Larger Particle Diameter in Case of Two Peaks (μm) | Ratio of Frequencies of Peak Tops [(frequency of peak top in particle diameter range of 0.4 to 0.7 μm)/(frequency of peak top in particle diameter range of 1.5 to 3.0 μm)] | D50 (μm) |
| Example 1 | 5.0 | 0.38 | 0.23 | 31 | 0.63 | 3.00 | 1.2 | 1.38 |
| Example 2 | 6.3 | 0.30 | 0.26 | 35 | 0.53 | 3.00 | 0.9 | 1.35 |
| Example 3 | 6.8 | 0.28 | 0.56 | 11 | 0.53 | 2.52 | 0.8 | 1.32 |
| Example 4 | 8.9 | 0.21 | 0.94 | 6 | 0.45 | 1.50 | 0.5 | 1.87 |
| Example 5 | 4.0 | 0.47 | 0.20 | 26 | 0.69 | 3.00 | 1.5 | 1.76 |
| Example 6 | 5.3 | 0.36 | 0.24 | 33 | 0.58 | 2.52 | 1.1 | 1.49 |
| Example 7 | 6.5 | 0.29 | 0.55 | 5 | 0.53 | 2.31 | 0.8 | 1.33 |
| Example 8 | 7.9 | 0.24 | 0.90 | 12 | 0.49 | 3.00 | 1.0 | 1.25 |
| Example 9 | 6.9 | 0.27 | 0.52 | 9 | 0.53 | 2.52 | 0.7 | 1.30 |
| Example 10 | 6.7 | 0.28 | 0.52 | 8 | 0.53 | 2.31 | 0.8 | 1.28 |
| Example 11 | 6.6 | 0.29 | 0.54 | 6 | 0.53 | 3.00 | 0.8 | 1.33 |
| Example 12 | 7.4 | 0.25 | 0.58 | 10 | 0.49 | 1.94 | 0.5 | 1.27 |
| Comparative Example 1 | 3.8 | 0.50 | 0.17 | 36 | 0.75 | — | — | 1.85 |
| Comparative Example 2 | 20.6 | 0.09 | 1.32 | 6 | 0.34 | 13.1 | — | 0.95 |
| Comparative Example 3 | 10.3 | 0.18 | 1.00 | 9 | 0.75 | 10.1 | — | 1.25 |
| Comparative Example 4 | 7.2 | 0.26 | 0.20 | 45 | 0.82 | — | — | 1.27 |
| Comparative Example 5 | 12.1 | 0.16 | 1.20 | 2 | 0.69 | — | — | 1.15 |
| Comparative Example 6 | 4.6 | 0.41 | 0.58 | 5 | 0.78 | — | — | 1.66 |
| Comparative Example 7 | 2.8 | 0.67 | 0.16 | 40 | 0.75 | — | — | 2.18 |
| Comparative Example 8 | 13.4 | 0.14 | 1.30 | 3 | 0.53 | — | — | 1.13 |
| Comparative Example 9 | 9.3 | 0.20 | 0.96 | 15 | 0.49 | — | — | 1.18 |
| Comparative Example 10 | 6.6 | 0.29 | 0.19 | 55 | 0.82 | — | — | 1.33 |
| Comparative Example 11 | 6.1 | 0.31 | 0.78 | 2 | 0.58 | 1.16 | 3.3 | 1.38 |
| Comparative Example 12 | 3.8 | 0.50 | 0.20 | 35 | 0.69 | 3.27 | — | 1.80 |
| Comparative Example 13 | 9.5 | 0.20 | 0.97 | 6 | 0.58 | — | — | 1.22 |
| Comparative Example 14 | 3.8 | 0.50 | 0.45 | 12 | 1.16 | 6.54 | — | 1.80 |
| Comparative Example 15 | 6.8 | 0.28 | 0.28 | 39 | 0.58 | — | — | 1.32 |
| Comparative Example 16 | 4.0 | 0.47 | 0.35 | 18 | 0.27 | 2.8 | 1.0 | 1.73 |
| Comparative Example 17 | 5.2 | 0.36 | 0.23 | 13 | 0.89 | 3.0 | 1.4 | 1.64 |

TABLE 1-continued

| | | | | | | | | |
|---|---|---|---|---|---|---|---|---|
| Comparative Example 18 | 7.9 | 0.21 | 0.93 | 11 | 0.45 | 1.4 | 1.5 | 1.35 |
| Comparative Example 19 | 5.1 | 0.37 | 0.22 | 35 | 0.63 | 3.3 | 1.1 | 1.60 |
| Comparative Example 20 | 5.8 | 0.32 | 0.48 | 4 | 0.53 | 2.5 | 0.3 | 1.39 |
| Comparative Example 21 | 8.0 | 0.24 | 0.65 | 12 | 0.49 | 2.5 | 1.7 | 1.18 |
| Comparative Example 22 | 5.4 | 0.35 | 0.62 | 12 | 0.67 | 2.0 | 1.5 | 1.15 |
| Comparative Example 23 | 3.7 | 0.51 | 0.50 | 46 | 0.69 | 2.8 | 2.8 | 1.98 |
| Comparative Example 24 | 2.0 | 0.92 | 0.41 | 26 | 0.69 | 3.9 | 3.9 | 3.10 |

| | Silicon Nitride Powder Measurement Results of Particle Size Distribution | | Silicon Nitride Sintered Body | | |
|---|---|---|---|---|---|
| | [(Particle Diameter of Peak Top in Particle Diameter Range of 1.5 to 3.0 μm)-(Particle Diameter of Peak Top in Particle Diameter Range of 0.4 to 0.7 μm)]/D50 | (Minimum Value of Particle Diameter)-(Maximum Value of Particle Diameter) (μm) | $D50/D_{BET}$ (μm/μm) | Relative Density (%) | Three-Point Bending Strength (MPa) | Thermal Conductivity (W/m·K) |
| Example 1 | 1.72 | 0.24-24 | 3.66 | 97.3 | 1015 | 103 |
| Example 2 | 1.83 | 0.10-20 | 4.52 | 97.7 | 1106 | 113 |
| Example 3 | 1.51 | 0.12-17 | 4.77 | 97.9 | 1192 | 117 |
| Example 4 | 1.21 | 0.10-6.5 | 4.14 | 98.5 | 1220 | 122 |
| Example 5 | 1.31 | 0.29-29 | 3.74 | 96.5 | 946 | 100 |
| Example 6 | 1.30 | 0.22-22 | 4.20 | 97.2 | 1077 | 105 |
| Example 7 | 1.34 | 0.15-15 | 4.59 | 97.8 | 1144 | 115 |
| Example 8 | 2.01 | 0.16-26 | 5.25 | 97.5 | 1178 | 111 |
| Example 9 | 1.53 | 0.13-17 | 4.76 | 98.8 | 1170 | 118 |
| Example 10 | 1.39 | 0.12-15 | 4.56 | 97.9 | 1152 | 116 |
| Example 11 | 1.86 | 0.15-20 | 4.67 | 97.8 | 1161 | 116 |
| Example 12 | 1.20 | 0.16-8.4 | 5.00 | 98.2 | 1173 | 120 |
| Comparative Example 1 | — | 0.32-31 | 3.73 | 85.6 | 574 | 83 |
| Comparative Example 2 | — | 0.061-37 | 10.39 | 98.1 | 658 | 123 |
| Comparative Example 3 | — | 0.16-31 | 6.83 | 98.3 | 640 | 129 |
| Comparative Example 4 | — | 0.13-24 | 4.85 | 97.2 | 575 | 133 |
| Comparative Example 5 | — | 0.072-10 | 7.37 | 88.6 | 776 | 99 |
| Comparative Example 6 | — | 0.15-17 | 4.06 | 85.7 | 522 | 81 |
| Comparative Example 7 | — | 0.32-34 | 3.24 | 84.8 | 500 | 56 |
| Comparative Example 8 | — | 0.066-13 | 8.01 | 89.6 | 779 | 94 |
| Comparative Example 9 | — | 0.061-34 | 5.84 | 87.1 | 725 | 90 |
| Comparative Example 10 | — | 0.072-31 | 4.67 | 88.2 | 804 | 95 |
| Comparative Example 11 | — | 0.11-9.3 | 4.47 | 86.3 | 576 | 87 |
| Comparative Example 12 | — | 0.32-31 | 3.63 | 89.0 | 586 | 84 |
| Comparative Example 13 | — | 0.086-12 | 6.16 | 88.2 | 830 | 103 |
| Comparative Example 14 | — | 0.32-48 | 3.63 | 83.0 | 486 | 52 |
| Comparative Example 15 | — | 0.24-34 | 4.77 | 88.6 | 792 | 92 |
| Comparative Example 16 | — | 0.27-29 | 3.68 | 93.1 | 836 | 100 |
| Comparative Example 17 | — | 0.24-24 | 4.56 | 94.2 | 848 | 102 |
| Comparative Example 18 | — | 0.056-31 | 6.43 | 94.8 | 833 | 99 |
| Comparative Example 19 | — | 0.24-26 | 4.32 | 94.6 | 849 | 101 |
| Comparative Example 20 | 1.43 | 0.19-11 | 4.34 | 95.1 | 930 | 86 |

TABLE 1-continued

| | | | | | | |
|---|---|---|---|---|---|---|
| Comparative Example 21 | 1.72 | 0.13-10 | 4.92 | 95.3 | 952 | 81 |
| Comparative Example 22 | 1.14 | 0.17-12 | 3.30 | 88.3 | 603 | 88 |
| Comparative Example 23 | 1.04 | 0.29-13 | 3.88 | 87.2 | 554 | 71 |
| Comparative Example 24 | — | 0.29-37 | 3.37 | 82.1 | 496 | 55 |

*Com. Ex.: Comparative Example

INDUSTRIAL APPLICABILITY

By using the silicon nitride powder according to the present invention, a silicon nitride sintered body having both high mechanical strength and high thermal conductivity and a circuit substrate using the same can be provided.

The invention claimed is:

1. A silicon nitride powder having a specific surface area of 4.0 to 9.0 m²/g, a β phase proportion of less than 40 mass %, and an oxygen content of 0.20 to 0.95 mass %, wherein a frequency distribution curve obtained by measuring a volume-based particle size distribution by a laser diffraction scattering method has two peaks, peak tops of said peaks are present respectively in a range of 0.4 to 0.7 μM and in a range of 1.5 to 3.0 μm, a ratio of frequencies of said peak tops ((frequency of the peak top in a particle diameter range of 0.4 to 0.7 μm)/(frequency of the peak top in a particle diameter range of 1.5 to 3.0 μm)) is 0.5 to 1.5, and a ratio $D50/D_{BET}$ (μm/μm) of a median diameter D50 (μm) determined by said measurement of particle size distribution to a specific surface area-equivalent diameter $D_{BET}$ (μm) calculated from said specific surface area is 3.5 or more.

2. The silicon nitride powder according to claim 1, wherein a ratio ΔDp/D50 calculated by dividing a difference ΔDp (μm) between the particle diameter (μm) at the peak top in the particle diameter range of 1.5 to 3.0 μm and the particle diameter (μm) at the peak top in the particle diameter range of 0.4 to 0.7 μm by said median diameter D50 (μm) is 1.10 or more.

3. The silicon nitride powder according to claim 2, wherein the β phase proportion is 5 to 35 mass %.

4. The silicon nitride powder according to claim 2, wherein a minimum value of the particle diameter determined by said measurement of particle size distribution is 0.10 to 0.30 μm and a maximum value of the particle diameter determined by said measurement of particle size distribution is 6 to 30 μm.

5. The silicon nitride powder according to claim 1, wherein the β phase proportion is 5 to 35 mass %.

6. The silicon nitride powder according to claim 5, wherein a minimum value of the particle diameter determined by said measurement of particle size distribution is 0.10 to 0.30 μm and a maximum value of the particle diameter determined by said measurement of particle size distribution is 6 to 30 μm.

7. The silicon nitride powder according to claim 1, wherein a minimum value of the particle diameter determined by said measurement of particle size distribution is 0.10 to 0.30 μm and a maximum value of the particle diameter determined by said measurement of particle size distribution is 6 to 30 μm.

8. A silicon nitride sintered body obtained by sintering the silicon nitride powder according to claim 1.

9. The silicon nitride sintered body according to claim 8, containing magnesium oxide and yttrium oxide as sintering aids for the silicon nitride powder.

10. The silicon nitride sintered body according to claim 8, wherein a thermal conductivity at room temperature (25° C.) is 100 W/m·K or more and a three-point bending strength at room temperature (25° C.) is 900 MPa or more.

11. A circuit substrate using the silicon nitride sintered body according to claim 8.

12. A silicon nitride sintered body obtained by sintering the silicon nitride powder according to claim 2.

13. A silicon nitride sintered body obtained by sintering the silicon nitride powder according to claim 5.

14. A silicon nitride sintered body obtained by sintering the silicon nitride powder according to claim 7.

15. The silicon nitride sintered body according to claim 9, wherein a thermal conductivity at room temperature (25° C.) is 100 W/m·K or more and a three-point bending strength at room temperature (25° C.) is 900 MPa or more.

16. A circuit substrate using the silicon nitride sintered body according to claim 9.

17. A circuit substrate using the silicon nitride sintered body according to claim 10.

* * * * *